(12) United States Patent
Nashner

(10) Patent No.: US 11,389,903 B2
(45) Date of Patent: Jul. 19, 2022

(54) ELECTRONIC DEVICE MARKED USING LASER-FORMED PIXELS OF METAL OXIDES

(71) Applicant: Apple Inc., Cupertino, CA (US)

(72) Inventor: Michael S. Nashner, San Jose, CA (US)

(73) Assignee: APPLE INC., Cupertino, CA (US)

( * ) Notice: Subject to any disclaimer, the term of this patent is extended or adjusted under 35 U.S.C. 154(b) by 357 days.

(21) Appl. No.: 16/298,987

(22) Filed: Mar. 11, 2019

(65) Prior Publication Data

US 2019/0299336 A1 Oct. 3, 2019

Related U.S. Application Data

(60) Provisional application No. 62/650,875, filed on Mar. 30, 2018.

(51) Int. Cl.
| | | |
|---|---|---|
| *B23K 26/362* | (2014.01) | |
| *B23K 26/00* | (2014.01) | |
| *B23K 26/062* | (2014.01) | |
| *H05K 5/02* | (2006.01) | |
| *H05K 5/04* | (2006.01) | |
| *H04M 1/02* | (2006.01) | |
| *B44C 1/22* | (2006.01) | |
| *B23K 26/0622* | (2014.01) | |

(52) U.S. Cl.
CPC ........ *B23K 26/362* (2013.01); *B23K 26/0006* (2013.01); *B23K 26/0624* (2015.10); *H05K 5/0243* (2013.01); *H05K 5/04* (2013.01)

(58) Field of Classification Search
None
See application file for complete search history.

(56) References Cited

U.S. PATENT DOCUMENTS

| 3,850,762 A | * | 11/1974 | Smith | ................. | B01D 61/145 |
|---|---|---|---|---|---|
| | | | | | 205/75 |
| 5,215,864 A | | 6/1993 | Laakmann | | |
| 5,235,169 A | | 8/1993 | Wakaumi et al. | | |
| 5,635,269 A | | 6/1997 | Weir et al. | | |

(Continued)

FOREIGN PATENT DOCUMENTS

| CN | 105283322 | 1/2016 |
|---|---|---|
| DE | 4106151 | 11/1991 |

(Continued)

OTHER PUBLICATIONS

Bai et al. ("Pore diameter control of anodic aluminum oxide with ordered array of nanopores," Electrochimica Act, 53(5):2258-22654 (Jan. 2008) (Year: 2008).*

(Continued)

*Primary Examiner* — Frank J Vineis
*Assistant Examiner* — Nicole T Gugliotta
(74) *Attorney, Agent, or Firm* — Brownstein Hyatt Farber Schreck, LLP

(57) ABSTRACT

A housing for an electronic device including a marking comprising multiple pixels is disclosed herein. The housing comprises one or more oxide layer, such as a metal oxide layer, and the marking comprises pixels formed into or within the oxide layer. In some instances, the pixels cooperate to form an image along an exterior surface of the electronic device.

19 Claims, 18 Drawing Sheets

(56) References Cited

U.S. PATENT DOCUMENTS

| | | | |
|---|---|---|---|
| 5,880,430 | A | 3/1999 | Wein |
| 6,518,544 | B2 | 2/2003 | Aberle et al. |
| 7,815,117 | B2 | 10/2010 | Tuschel et al. |
| 7,875,414 | B2 | 1/2011 | Sawada et al. |
| 7,975,913 | B2 | 7/2011 | Kubota et al. |
| 8,330,122 | B2 | 12/2012 | Smith et al. |
| 8,398,841 | B2 | 3/2013 | Khosla |
| 8,424,751 | B2 | 4/2013 | Liu et al. |
| 8,534,540 | B2 | 9/2013 | Gratton et al. |
| 8,715,725 | B2 | 5/2014 | Stuck et al. |
| 8,912,465 | B2 | 12/2014 | Kuo |
| 9,135,543 | B2 | 9/2015 | Lancaster-Larocque |
| 9,235,997 | B2 | 1/2016 | Kawanami |
| 9,639,224 | B2 | 5/2017 | Lee et al. |
| 9,644,283 | B2 | 5/2017 | Hankey et al. |
| 9,679,187 | B2 | 6/2017 | Bhagavat et al. |
| 9,871,897 | B1 | 1/2018 | Lyon et al. |
| 10,131,035 | B1 | 11/2018 | Brickner et al. |
| 2006/0056028 | A1 | 3/2006 | Wildnauer |
| 2009/0171654 | A1 | 7/2009 | Spain |
| 2010/0054287 | A1 | 3/2010 | Ghauri |
| 2013/0083500 | A1* | 4/2013 | Prest ............... B41M 5/262 361/757 |
| 2013/0299357 | A1* | 11/2013 | Lai ............... C25D 11/243 205/202 |
| 2014/0076600 | A1* | 3/2014 | Browning ............... C25D 11/02 174/50 |
| 2014/0284096 | A1* | 9/2014 | Wu ............... H05K 5/04 174/520 |
| 2014/0338191 | A1 | 11/2014 | Petcavich |
| 2015/0367443 | A1 | 12/2015 | Nashner et al. |
| 2017/0121838 | A1* | 5/2017 | Tatebe ............... H05K 5/0243 |
| 2017/0347476 | A1* | 11/2017 | Hwang ............... C25D 11/022 |

FOREIGN PATENT DOCUMENTS

| | | |
|---|---|---|
| FR | 2975617 | 11/2012 |
| JP | H09296589 | 11/1997 |
| JP | 2001270300 | 10/2001 |

OTHER PUBLICATIONS

Kikuchi et al., "Growth of porous type anodic oxide films at micro-areas on aluminum exposed by laser irradiation," Electrochimica Acta, vol. 54, No. 27, pp. 7018-7024, Nov. 30, 2009.

* cited by examiner

ELECTRONIC DEVICE MARKED USING LASER-FORMED PIXELS OF METAL OXIDES

CROSS-REFERENCE TO RELATED APPLICATION(S)

This application is a nonprovisional patent application of and claims the benefit of U.S. Provisional Patent Application No. 62/650,875 filed Mar. 30, 2018 and titled "Electronic Device Marked Using Laser-Formed Pixels of Metal Oxide," the disclosure of which is hereby incorporated by reference in its entirety.

FIELD

The described embodiments relate generally to markings formed on an electronic device housing. More particularly, embodiments described herein relate to images comprising multiple pixels formed within oxide layers along an exterior surface of a housing.

BACKGROUND

Electronic devices generally include a housing or other exterior component that may be marked or printed. Traditionally, an image or marking is formed along the exterior surface of the device using an ink or paint that is applied to the housing. While some traditional printing techniques may provide adequate detail or color reproduction, the markings may be subject to wear and/or degradation as the device is used over a period of time. In particular, portable electronic devices that are regularly handled and transported may be susceptible to wear and traditional ink-based or paint-based markings may scratch, fade, or otherwise degrade over the lifetime of the device.

Embodiments described herein are directed to markings for an electronic device that may have advantages as compared to some traditional techniques. The techniques described herein are generally directed to markings that may include an image or form that includes an array of small pixels formed into an oxide layer of the housing or enclosure. The markings described herein may be durable and can provide a distinctive appearance to the electronic device. In general, the markings formed using the described techniques may not suffer from the drawbacks associated with some traditional ink-based marking techniques.

SUMMARY

Embodiments described herein relate to markings formed along exterior surfaces of electronic device housings and techniques for forming the markings. The marking may be in the form of an image, a pattern, text, a glyph, or another surface feature. In particular, the marking may be formed at least in part in an oxide layer, such as a metal oxide layer, on a metallic portion of the electronic device housing.

In embodiments, the marking comprises one or more localized elements. For example, the marking or a feature of a marking may comprise multiple pixels. The appearance of pixels in the marking may differ in one or more of color, brightness, or gloss.

In embodiments, the marking may simulate a continuous tone image or feature of an image. For example, the marking may create the illusion of a continuous line and/or shape. In some embodiments, a marking in the form of an image has from about 20 pixels per mm (approximately 500 dpi) to about 200 pixels per mm (approximately 5000 dpi). The image may be a grayscale image or a multi-color image.

In embodiments, at least one pixel has a structural color. Structural colors may result from a variety of effects including interference of light, diffraction of light, and combinations thereof, rather than from the presence of a paint or an ink. In embodiments described herein, an image includes pixels which are differently colored due, in part, to differences in thickness of an oxide layer along an exterior surface of a housing.

In embodiments, a pixel may display a color as a result of interference of light reflected from the metal oxide and the underlying metallic substrate. Typically the interference color displayed depends upon the thickness of the metal oxide. A metal oxide having a thickness too great to display interference colors may appear dark. When the metal oxide is very thin (or is not present), the pixel may appear bright or metallic. In embodiments, the metal oxide thickness of a given pixel may have a thickness or a thickness range configured to produce a desired hue or combination of hues, such as at a desired viewing angle.

In an example, an electronic device housing comprises: a metallic substrate; an oxide layer formed on the metallic substrate and comprising a metal oxide, and an image defined, in part, by an array of pixels formed within the oxide layer. The array of pixels may comprise a first pixel having a first color defined, in part, by a first thickness of a first portion of the oxide layer, a second pixel having a second color different from the first color and defined, in part, by a second thickness of a second portion of the oxide layer, and a third pixel having a third color different from the first and second colors and defined, in part, by a third thickness of a third portion of the oxide layer.

The oxide layer may comprise a thermally grown metal oxide. A pattern of oxide layer thicknesses may be formed using one or more laser-based processes to remove sections of the oxide layer. In additional embodiments, the array of pixels may comprise multiple sets of pixels, each set of pixels having a desired color and formed by the one or more laser-based processes. For example, a first set of pixels may have a first color, a second set of pixels may have second color, and a third set pixels may have a third color. In addition, the array may further comprise a fourth pixel having a fourth color defined, in part, by the metallic substrate.

In some embodiments, the metallic substrate defines a recess having a recess surface surrounded by a set of recess walls. The oxide layer and the pixels of the image may be formed within the recess along the recess surface. The recess may be created by laser engraving followed by downward growth of the oxide layer. Recessing an outer surface of the oxide layer with respect to an outer surface of the metallic substrate may provide some protection to the oxide layer.

In additional embodiments described herein, an image includes differently colored pixels defined by different metal oxides. As an example, different metal oxides may be colored with different dyes or pigments to produce different hues. Further, pixels with different levels of brightness may be obtained when metal oxides are grown from differently polished portions of the metallic substrate.

As an example, an electronic device housing comprises: a metallic substrate; an oxide layer formed on the metallic substrate; and an image defined, in part, by the oxide layer. The image includes a set of pixels comprising a first pixel having a first color and defined by a first metal oxide anodically grown on a first portion of the metallic substrate. The oxide layer further comprises a second pixel having a second color different from the first color and defined by the second metal oxide anodically grown on a second portion of the metallic substrate adjacent to the first portion.

In some embodiments, an electronic device comprises an electronic device housing comprising a marking as described herein. The electronic device may further comprise a display and a cover layer to allow viewing and protection of the display. In addition, the electronic device may comprise one or more of a sensor, a processor, memory, control circuitry, a battery, an input device, an output device, a communication port or an accessory.

In aspects, a method for making an image as described herein comprises thermally growing an oxide layer on a metallic substrate of an electronic device housing using a laser-based process. The method further comprises ablating sections of the oxide layer to form pixels of the image. The operation of ablating sections of the oxide layer may use one or more laser-based processes. The spot size of the laser used in the laser-based process may determine the width and/or shape of the pixels.

In embodiments, a method of forming an image along an exterior surface of the metallic housing component comprises forming a recess along the exterior surface of the metallic housing component by ablating the metallic housing component using a first laser-based process. The method further comprises thermally growing an oxide layer comprising a metal oxide along a surface of the recess, the oxide layer grown using a second laser-based process. In addition, the method comprises forming an image in the oxide layer by: ablating a first section of the oxide layer to define a first pixel having a first thickness and a first color using a third laser-based process; ablating a second section of the oxide layer to define a second pixel having a second thickness and a second color using a fourth laser-based process; and ablating a third section of the oxide layer to define a third pixel having a third thickness and a third color using a fifth laser-based process.

In additional aspects, methods for making an image as described herein relate to forming differently colored pixels defined by metal oxides grown in different anodization steps. In embodiments, a method of forming an image along an exterior surface of a housing formed from a metal component comprises anodically growing a first metal oxide along the exterior surface of the metal component of the housing. The first metal oxide may be dyed using a first pigment to produce a first color and sealed. The method further comprises forming an image within the first metal oxide by forming an array of pixels. A first pixel of the array of pixels may be formed by: ablating a first section of the first metal oxide to expose a first portion of the metal component using a first laser-based process; laser polishing the first portion of the metal component to form a first polished region using a second laser-based process; and anodically growing a second metal oxide along the first polished region. The second metal oxide may be dyed using a second pigment to produce a second color different from the first color and sealed. A second pixel of the array of pixels may be formed by: ablating a second section of the first metal oxide to expose a second portion of the metal component using a third laser-based process; laser polishing the second portion of the metal component to form a second polished region using a fourth laser-based process; and anodically growing a third metal oxide along the second polished region. The third metal oxide may be dyed using a third pigment to produce a third color different than the first color and the second color and sealed.

BRIEF DESCRIPTION OF THE DRAWINGS

The disclosure will be readily understood by the following detailed description in conjunction with the accompanying drawings, wherein like reference numerals designate like elements.

Figure 1A:
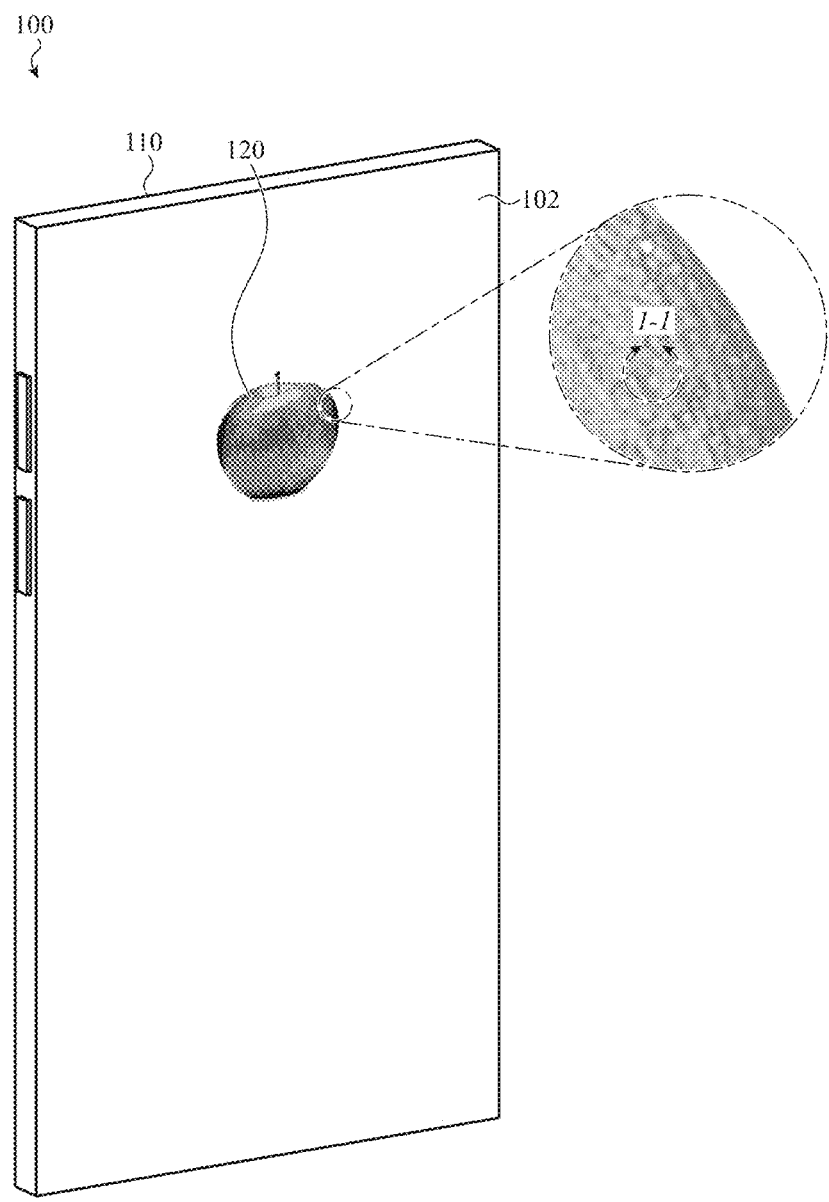
FIG. 1A shows a perspective view of an electronic device with a marking in accordance with embodiments herein.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The current description is generally directed to forming a marking in a housing or enclosure of an electronic device. The marking may include an image, text, symbols, indicia, or other visual feature. The marking may include a pixelated image or pixelated marking. The terms pixelated image or pixelated marking may be used to refer to an image or a marking that is formed from a collection of distinct pixels. A marking or image may also be referred to as having a pixelated appearance, which may mean that individual pixels or groups of pixels are visually discernable by the human eye at a normal viewing distance.

In embodiments described herein, a marking may be formed at least in part in an oxide layer disposed on or formed along a metallic substrate, such as a metallic component of the housing. In general, the marking may include an image or form that includes a group of pixels (localized elements). The pixels may be different in appearance and together cooperate to form an image that appears to be smooth or continuous. In some cases, the image may be described as not appearing to be pixelated even though it may be formed from pixels that are not individually discernable to the human eye. In embodiments, the size of the pixels is from about 10 µm to about 50 µm. The size of a pixel may be a width of the pixel. If the pixel is rounded in shape, the diameter of the pixel may determine the width of the pixel.

For example, pixels may differ in color and/or texture. In embodiments described herein, the color of each pixel may be adapted using various techniques of forming or modifying an oxide layer of a metallic substrate or metallic component of an electronic device. In one set of examples, a laser is used to selectively ablate an oxide layer to produce pixels having different oxide layer thicknesses. The color of the pixels may be determined, at least in part, by the thickness of the oxide layer that remains after the laser ablation. In another set of examples, different colored pixels are formed by ablating away a portion of an oxide layer to form a recess and then anodically growing another or second oxide within the recess. The second oxide may have a color that is due in part to a dye or pigment that is incorporated into the second oxide. The color of the second oxide may also be due, at least in part, to a surface finish of the substrate after the ablation. In some cases, the substrate is polished using one or more laser-based polishing operations, which may also affect the color of the pixel.

In some embodiments, multiple pixels of the image may be grouped together. A group of multiple pixels may function as one of a set of halftone dots for simulation of a continuous tone image and may be referred to herein as a multi-pixel dot. The image area may be divided into cells, and the number and/or colors of the pixels in the multi-pixel dots varied from one cell to another. In additional embodiments, multiple pixels may be grouped together so that the group as a whole appears to have a color visually distinct from one or more colors of the individual pixels. The apparent color of a multi-pixel dot may be due to additive mixing of light from the pixels in the dot. Standard sets of colors used in color mixing include RYB (red, yellow, and blue), CMY (cyan, magenta, and yellow), and CMYK (cyan, magenta, yellow, and black).

These and other embodiments are discussed below with reference to FIGS. 1A-13. However, those skilled in the art will readily appreciate that the detailed description given herein with respect to these figures is for explanatory purposes only and should not be construed as limiting.

FIG. 1A depicts a simplified example of an electronic device. As shown in FIG. 1A, the electronic device 100 includes a housing 110 having a surface 102 on which a marking 120 has been formed. The placement of the marking 120 on the surface 102 is for illustration purposes and is merely an example. Markings, as described herein, may be placed on any suitable surface of an electronic device housing, including curved regions of the housing 110. The housing 110 may be formed from one or more metal or metallic components and may also be referred to as an enclosure. The marking techniques described herein may be used to part an exterior surface of the housing 110 including a housing component, enclosure component, cover, or other component that defines an exterior surface of the housing 110.

In aspects of the disclosure, the electronic device incorporates one or more electronic components. The electronic device may be a portable electronic device or other suitable electronic device. In some embodiments, the electronic device 100 may be a mobile telephone, a notebook computing device (e.g., a notebook), a tablet computing device (e.g., a tablet), a portable media player, a wearable device, or another type of portable electronic device. As additional examples, the portable electronic device may be a wristwatch, a media player, a camera, a headphone device, an earpiece device, a remote control, an identifier (e.g., a card), computer component, input device, or virtually any other type of electronic product or device component. For example, the electronic components may include one or more of a processor, control circuitry, a sensor, memory, and a battery. Further discussion of electronic components is provided with respect to FIG. 13.

Figure 1B:
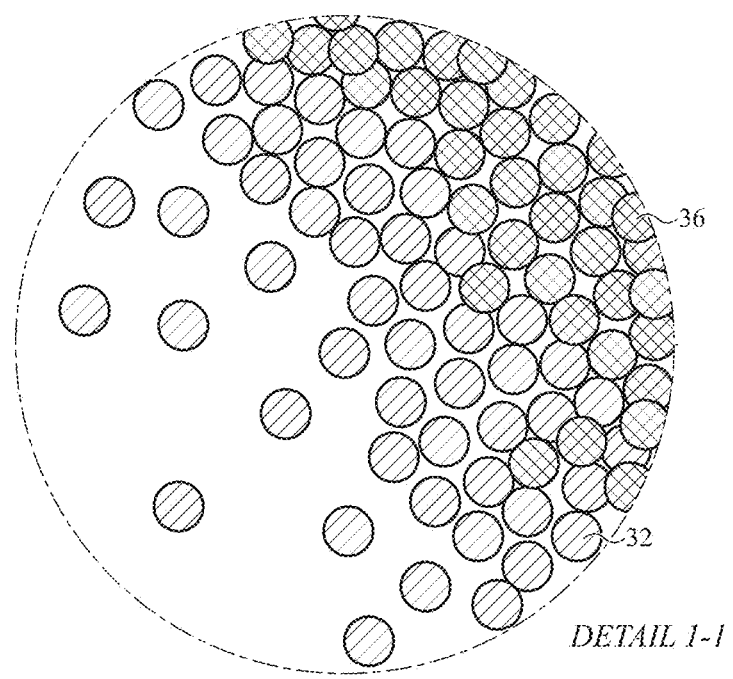
FIG. 1B shows an enlarged view of the marking of FIG. 1A depicting a pixel pattern.

As shown in the inset of FIG. 1A and the enlarged view of FIG. 1B, marking 120 is an image comprising multiple pixels. Such an image may be referred to as a pixelated image as it includes multiple pixels. In some cases, the marking 120 or image may appear to be pixelated, which may refer to an arrangement of pixels in which the individual pixels are visually discernable at a particular viewing distance, which may correspond to a normal viewing distance. The marking 120 may be characterized as not appearing to be pixelated if individual pixels are not visually discernable at a particular viewing distance. For example, in some embodiments, lines and/or shapes in the image appear to be continuous rather than formed of discrete pixels when viewed from a typical viewing distance as is illustrated in FIG. 1A. As a specific example, individual pixels may not be separately visually distinguishable when the marking 120 is viewed from a particular viewing distance, such as a distance greater than about 5 cm, 10 cm, or 25 cm. Further, the pixels may not be discernable as separate pixels or visually distinct from a particular viewing distance. In some embodiments, a marking in the form of an image has from about 20 pixels per mm (approximately 500 dpi) to about 200 pixels per mm (approximately 5000 dpi). In embodiments, the term "about" may indicate a variation of +/−10% or +/−5% about the stated value.

In FIG. 1B, a portion of the marking of FIG. 1A has been enlarged to show multiple pixels, such as pixels 32 and 36. Adjacent pixels may overlap or may not overlap. For example, adjacent pixels may abut each other, but not overlap. The pixels may have shapes that are generally circular, elliptical, rectangular, square, or combinations thereof. Further, the pixels may have shapes formed by overlapping of features that are generally circular, elliptical, rectangular, square, or combinations thereof, where the features are formed at least in part by a laser-based treatment as described herein. The pixels may have the same shape and/or size or may differ in shape and/or size. FIG. 1B illustrates some pixels which are generally circular in shape and others which have shapes formed by overlapping of generally circular features. In embodiments, some pixels may have a shape determined by the interstitial region between other pixels, such as the interstitial region between the circular pixels to the left in FIG. 1B. While the pixels are depicted as being generally round in shape in FIG. 1B, for purposes of illustration, the example pixels depicted in FIGS. 2A-4C and 7A-8D are depicted as having a square shape. However, the principles used to form the pixels depicted in FIGS. 2A-4C and 7A-8D may be used to form the round pixels of FIG. 1B.

In embodiments, the pixels have multiple colors and the image is a multi-color image. For example, pixels 32 and 36 of FIG. 1B are shown with different hatching to indicate different colors. The apparent color at a particular position in the image may be due to the combined effect of multiple pixels. For example, multiple pixels may be grouped together so that the group as a whole appears to have a color visually distinct from one or more colors of the individual pixels. For example, a group of three pixels, each having a different color, may appear to have a fourth color that is different from that of each of the three pixels.

A given pixel of the marking may appear essentially colorless, may appear to have a distinct color, or may appear to have a blending of colors. The color of a pixel may be characterized using a color model. For example, in the hue-saturation-value (HSV) color model, the hue relates to the wavelength(s) of visible light observed when the pixel is viewed (e.g., blue or magenta) and the value relates to the lightness or darkness of a color and relates to the amount of light reflected from the pixel. The saturation relates to the perceived colorfulness as judged in proportion to its brightness. As another example, coordinates in CIEL*a*b* (CIELAB) color space may be used to characterize the color, wherein L* represents brightness, a* the position between red/magenta and green, and b* the position between yellow and blue. A broadband or semi-broadband illuminant may be used to determine the color of the color feature. For example, a CIE illuminant may be used.

Further, colors may be characterized in terms of perceived wavelengths of visible light (e.g., from about 380 nm to about 750 nm). Chromatic colors have a hue (such as predominantly red, blue, yellow or green). A spectral color is present in the visible spectrum and is associated with a relatively narrow band of wavelengths. Non-spectral colors may include achromatic colors (such as white, gray or black), colors that are mixtures of spectral colors (such as violet-red colors), colors that are mixtures of spectral colors with achromatic colors, and metallic colors. For example, a violet color may be associated with light having a wavelength from about 380 nm to about 450 nm, a blue color may be associated with light having a wavelength between about 450 nm to about 495 nm, a cyan color may be associated with light having a wavelength from about 490 nm to about 520 nm, a green color may be associated with light having a wavelength between 495 nm and 570 nm, a yellow color may be associated with light having a wavelength from about 570 nm to about 590 nm, an orange color may be associated with light having a wavelength from about 590 nm to 620 nm, and a red color may be associated with light having a wavelength from about 620 nm to about 750 nm. In addition, a magenta color may be associated with light having predominantly red wavelengths and blue/violet wavelengths.

A pixel having a metallic color may have a metallic luster. For example, a metallic color with a metallic luster may have a spectral reflectance curve with a relatively high reflectance over a relatively large portion of the visible spectrum and may have predominantly specular reflection. In embodiments, a pixel with a metallic luster has a spectral reflectance of at least 80%, at least 70%, at least 60%, at least 50%, or at least 40% over at least a portion of the visible spectrum. In embodiments, a metallic color may have a largely gray or "silvery" appearance when the spectral reflectivity is substantially uniform across the visible spectrum. The laser coloring process may produce a structural color which modifies a gray or "silvery" appearance of a metal. For example, a laser coloring process may change the spectral reflectance curve to decrease the reflectance in at least a portion of the blue and/or the green portion of the visible spectrum, thereby producing an at least partially golden color.

A marking as described herein may be formed along an exterior metallic surface of the electronic device. For example, the marking may be placed on a metallic surface of the electronic device as illustrated in FIG. 1A. In embodiments, the marking may be formed along an exterior surface of a metal component of a housing. A metal component of a housing may also be referred to as a metallic housing component. As examples, a metal component of the housing may form an enclosure or band of the housing. In additional examples, the metal component may provide a panel or inset of the housing. In embodiments described herein, the marking is at least partly formed within an oxide layer along an exterior surface of the housing, with the metallic surface acting as a substrate for the oxide layer.

In embodiments, the oxide layer comprises a metal oxide grown from the metallic surface of the electronic device. When the metal oxide is grown by oxidation of the metallic substrate, the metal oxide comprises a metal that is the same as a metal present in the metallic substrate. When the metallic substrate comprises a base metal with additional metallic alloying elements, the metal oxide may comprise the base metal, an additional metallic alloying element, or a combination thereof. For example, when the metallic substrate is formed of an aluminum alloy the oxide layer may comprise an aluminum oxide. As an additional example, when the metallic substrate is formed of a chromium containing steel, the oxide layer formed by oxidation of the steel may comprise a chromium oxide as well as an iron oxide. Further, when the metallic substrate is formed of a titanium alloy the oxide layer may comprise a titanium oxide. In embodiments, the oxide layer comprises at least 50% metal oxide, at least 60% metal oxide, at least 70% metal oxide, at least 80% metal oxide, at least 90% metal oxide, or substantially consists of one or more metal oxides.

In some embodiments, the oxide layer comprises a thermally grown metal oxide. For example, an oxide layer comprising a metal oxide may be thermally grown on a metallic substrate by laser heating of the substrate. Suitable metallic substrates include, but are not limited to, titanium alloy, steel, or zirconium-based, titanium-based, or iron-based bulk solidifying alloy substrates. In some embodiments, a thermally grown oxide layer may have a porosity less than a porosity of an anodically grown oxide layer.

In other embodiments, the oxide layer comprises an anodically grown metal oxide. In embodiments, the anodically grown metal oxide comprises pores and may be termed a porous anodic metal oxide. In embodiments, the average diameter of the pores is from 10 nm to 40 nm. Suitable metallic substrates include, but are not limited to, aluminum alloy, titanium alloy, magnesium alloy, or steel substrates. Steel substrates include, but are not limited to austenitic stainless steel substrates. In some embodiments, the porosity of the anodically formed oxide layer allows a color to be imparted to the metal oxide by introducing a colorant such as a dye into the pores. The pores of the oxide layer may be sealed prior to use of the device. In some embodiments, the oxide layer may further comprise a hydroxide formed during sealing of the pores.

In some embodiments, the marking may be coated with a transparent layer after being formed to provide additional protection for the marking. The transparent layer may be thin relative to a thickness of the oxide layer. For example, the marking may be coated with a polymeric coating. The polymeric coating may be a hydrophobic and/or oleophobic coating including a fluorinated material. As another example, the marking may be coated with a transparent inorganic material by a physical vapor deposition technique.

FIGS. 2A-12 depict example configurations of pixel patterns for an electronic device housing. Some elements have been enlarged for convenience of illustration of the pixels. The pixels are shown as generally square for convenience of illustration, but the pixel shapes shown are not intended to be limiting. As examples, a pixel may have a circular, elliptical, rectangular, or square shape. A described above, with respect to FIG. 1B, pixels are depicted as being generally round in shape. However, for purposes of illustration and clarity, the example pixels depicted in FIGS. 2A-4C and 7A-8D are depicted as having a square shape. However, the principles used to form the pixels depicted in FIGS. 2A-4C and 7A-8D may be used to form the round pixels of FIG. 1B or pixels having another non-square shape.

In embodiments, the image of FIG. 1A may be formed using an oxide layer having portions of different thickness on a metallic substrate of the electronic device. Differences in thickness of the oxide layer can create differences in the appearance of the pixels of the image. For example, the color of a first pixel may be defined, in part, by a first thickness of a first portion of the oxide layer. Similarly, the color of a second pixel may be defined, in part, by a second thickness of a second portion of the oxide layer. The composition of the first metal oxide may be essentially the same as or different from the composition of the second metal oxide. The oxide layer may comprise a thermally grown metal oxide layer, such as a metal oxide layer grown by laser heating of the metallic part. The different thicknesses of the oxide layer may be achieved by laser removal or ablation of sections of the oxide layer. FIGS. 2A-4C show several ways to form pixels of an image with an oxide layer having portions of different thickness.

Figure 2A:
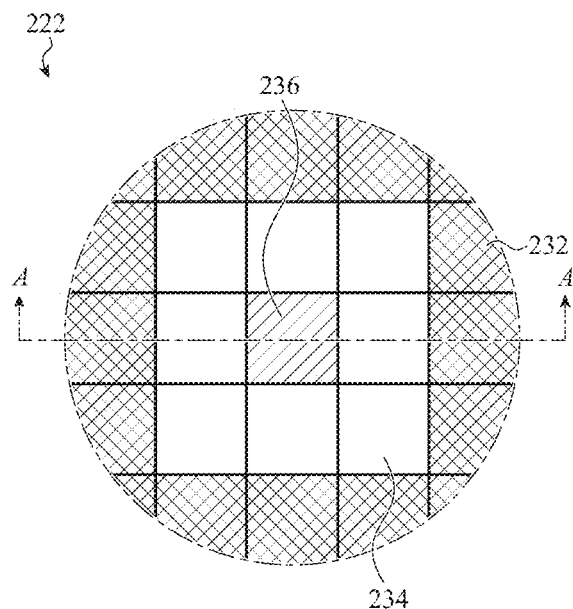
FIG. 2A is a schematic top view of a pixel pattern.
Figure 2B:
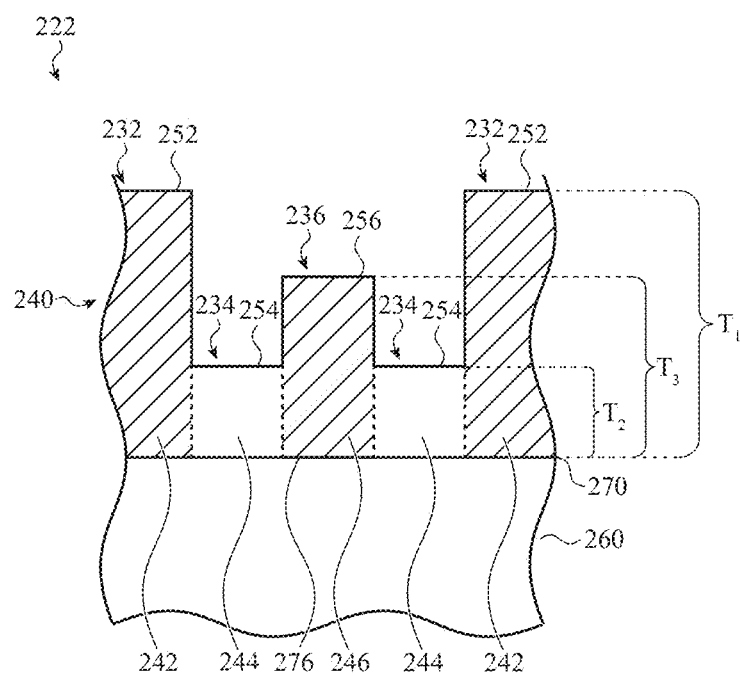
FIG. 2B shows a schematic cross-sectional view of the pixel pattern of FIG. 2A along line A-A according to one embodiment.

FIG. 2A is a schematic top view of a pixel pattern 222 produced using an oxide layer having three different thicknesses. As shown in FIG. 2B, each of the pixels 232, 234, and 236 is associated with a different thickness of the oxide layer and a different color. For simplicity, the pixels 232, 234, and 236 as shown as abutting each other. In additional embodiments, the pixels may be separated from one another or may overlap each other as shown in FIG. 1B.

FIG. 2B is a cross-sectional view of the pixel pattern 222 of FIG. 2A. As depicted metal oxide layer 240 is disposed on a metallic substrate 260 to form interface 270. A first portion 242 of metal oxide layer 240 has a first thickness $T_1$ and defines first pixel 232. A second portion 244 of metal oxide layer 240 has a second thickness $T_2$ and defines second pixel 234. A third portion 246 of metal oxide layer 240 has a third thickness $T_3$ and defines third pixel 236. Surface 252 of first portion 242, surface 254 of second portion 244, and surface 256 of third portion 246 are also shown. As shown, the portions of the metal oxide layer 240 having a greater thickness have a darker appearance in the top view of FIG. 2A. For example, first pixel 232, which has the greatest thickness, also has the darkest appearance in the top view of FIG. 2A. Conversely, the portions of the metal oxide layer 240 having a lesser thickness have a lighter appearance.

In FIG. 2B, each of first portion 242, second portion 244 and third portion 246 is shown as having a uniform thickness. However, in other examples a portion of the metal oxide layer 240 defining a given pixel may have some variation in thickness. In some embodiments, a portion of the metal oxide layer 240 defining a given pixel may be described by an average thickness. In further embodiments, a portion of the metal oxide layer 240 defining a given pixel may be described by a thickness range. For example, the thickness range of a given pixel or set of pixels may be configured to produce a desired hue or combination of hues. The desired hue or combination of hues may be produced at a desired viewing angle, such as a viewing angle approximately normal to the top surface of the oxide layer. In embodiments, the variation in thickness of a portion of the metal oxide layer 240 defining a pixel is +/−10% or +/−5%. If the variation in the thickness of the oxide layer across one or more pixels is sufficiently large, the pixel or group of pixels may appear to blend different colors. In embodiments, pixels differing in color may differ in thickness, average thickness and/or thickness range.

In some embodiments, at least one pixel of the pattern has a structural color. For example, the pixel may have a color least in part as a result of interference of visible light reflected from the surface of the portion of the metal oxide layer 240 and from the interface 270 of the portion of the metal oxide with the underlying metallic substrate 260. The color is based at least in part on the composition of the metal oxide layer 240, the thickness of the metal oxide layer 240, the type of light incident on the surface, and the viewing angle. In embodiments, pixels formed from a given thermally grown metal oxide will have the substantially same color when they have substantially the same thickness.

For example, the third portion 246 of metal oxide layer 240 may have a thickness $T_3$ selected so that interference of light in the visible spectrum reflected from outer surface 256 and from interface portion 276 gives the third portion 246 of metal oxide layer 240 and third pixel 236 a colored appearance. In additional examples, first portion 242 and/or third portion 246 of metal oxide layer 240 may also have a color resulting from light interference.

In general, a metal oxide layer thickness suitable to achieve a color from light interference may depend on the composition and crystallinity of the layer as well as the desired color to be achieved. In embodiments, the thickness of the oxide layer (such as the thickness of first, second, and third portions 242, 244 and 246 of metal oxide layer 240) may be from 50 nm to 500 nm to obtain a color through interference of light. In embodiments, the metal oxide may comprise a titanium oxide, an iron oxide, a chromium oxide, a zirconium oxide or combinations thereof. A variety of colors may be obtained, including, but not limited to, blue, purple, pink, red, orange, yellow, gold, brown, and green.

In additional embodiments, at least one pixel of the pattern displays a color due to substantial absorption of light by the corresponding portion of the metal oxide layer 240. In an example, first pixel 232 appears relatively dark because the first portion 242 of the metal oxide layer 240 is sufficiently thick to absorb a substantial amount of visible light incident on first portion 242.

The reflectance of the portion of the metal oxide layer 240 may also affect the brightness of the pixel, with higher reflectance producing increasing brightness. The reflectance of a first portion 232 may be affected by the roughness of a top surface of the portion of the metal oxide layer defining the pixel and by the roughness at the interface 270 between the portion of the metal oxide layer and the substrate 260. Reflectance is typically a function of wavelength of the incident light. As referred to herein, the reflectance may be measured at a particular wavelength, over a particular range of wavelengths, or over the entire range of the visible spectrum and is the ratio of the total amount of radiation reflected by a surface to the total amount of radiation incident on the surface (for example, surfaces 252, 254, and 256).

In some embodiments, at least one pixel of the pattern appears relatively bright because the corresponding portion of the metal oxide layer 240 does not absorb substantial amounts of light. In an example, pixel 234 appears bright because the second portion 244 of the metal oxide layer 240 is sufficiently thin that it does not absorb a substantial amount of visible light incident on the second portion 244.

Figure 3A:
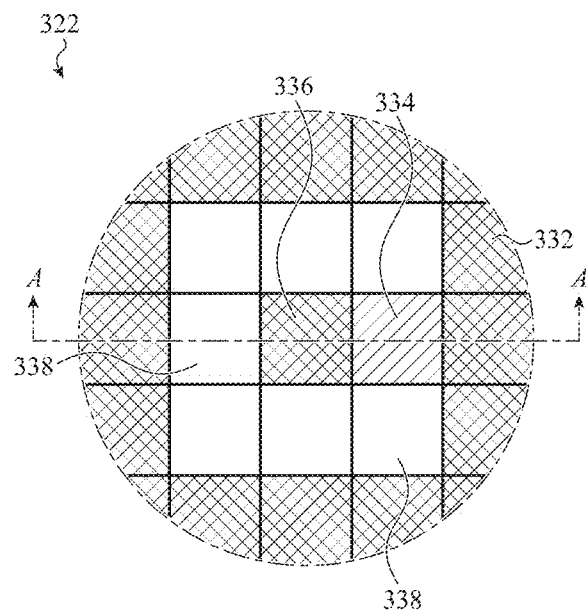
FIG. 3A is a schematic top view of another pixel pattern.
Figure 3B:
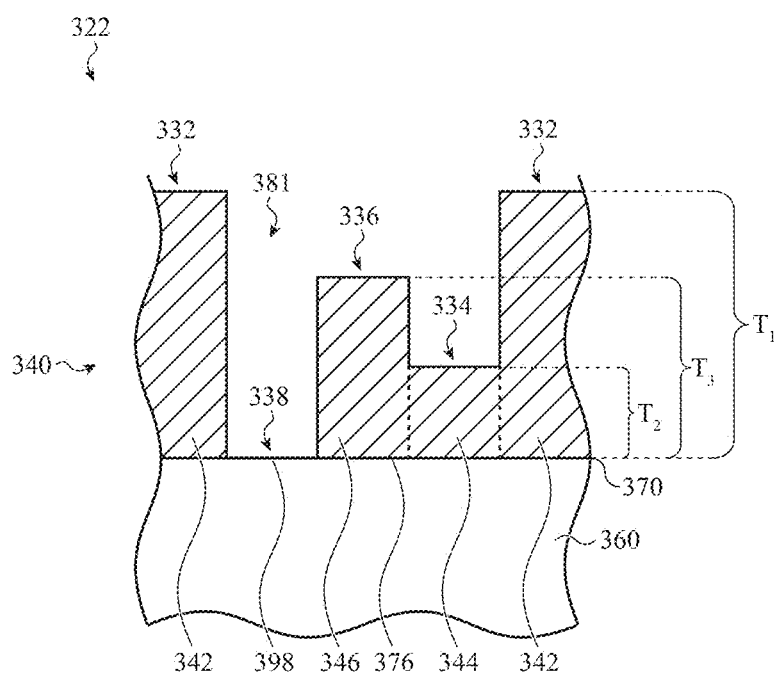
FIG. 3B shows a schematic cross-sectional view of the pixel pattern of FIG. 3A along line A-A according to one embodiment.

FIG. 3A is a schematic top view of another pixel pattern 322 produced using a metal oxide layer having three different thicknesses, as well as a void or opening which exposes the metal substrate. The pattern comprises pixels 332, 334, 336, and 338 each of which has a different color. As shown in FIG. 3B, each of pixels 332, 334, and 336 is associated with a different thickness of oxide layer and pixel 338 is associated with a void in the oxide layer. As an example, the first pixel 332 may have a green hue, the second pixel 334 may have a blue hue, the third pixel 336 may have a yellow hue, and the fourth pixel 338 may have a metallic appearance. While these colors are provided by way of example, other colors and other color combinations may be achieved using the techniques described herein.

FIG. 3B is a cross-sectional view of the pixel pattern 322 of FIG. 3A. As depicted, metal oxide layer 340 is disposed on a metallic substrate 360 to form interface 370. A first portion 342 of metal oxide layer 340 has a first thickness $T_1$ and defines first pixel 332. A second portion 344 of metal oxide layer 340 has a second thickness $T_2$ and defines second pixel 334. A third portion 346 of metal oxide layer 340 has a third thickness $T_3$ and defines third pixel 336. Pixel 338 corresponds to removal of a portion of the metal oxide layer 340, and the pixel 338 is defined by surface 398 of the metallic substrate 360. As shown, the portions of the metal oxide layer 340 having a greater thickness have a darker appearance in the top view of FIG. 3A. For example, first pixel 332, which has the greatest thickness, also has the darkest appearance in the top view of FIG. 3A.

In some embodiments, exposed portion 398 of the metallic substrate 360 is not substantially recessed with respect to interface portion 376 under third portion 346 of the metal oxide layer 340. For example, exposed portion 398 may be recessed with respect to interface portion 376 by 5 µm or less, 3 µm or less, 2 µm or less, or 1 µm or less. In addition, exposed portion 398 may further include a surface texture (e.g., a surface roughness) as a result of laser removal of the metal oxide layer 340 above. In some embodiments, exposed portion 398 may be treated with another laser to modify its texture, for example by polishing the exposed portion as described herein.

In additional embodiments, a monochromatic image (e.g., a grayscale image) may be formed from three or more shades of a single color. For example, a first set of pixels may have the darkest appearance and the thickest portions of the metal oxide layer, a second set of pixels may have the brightest appearance and the thinnest portions of the metal oxide layer (e.g., where the metal oxide layer may have been substantially removed), and a third set of pixels may have a brightness and a thickness of the metal oxide layer intermediate between the first set of pixels and the second set of pixels. Further, the monochromatic image may be at least partially surrounded by an additional portion of the metal oxide layer which has a thickness about the same as that of the first set of pixels.

Figure 4A:
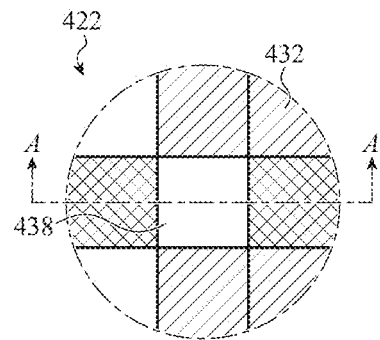
FIG. 4A is a schematic top view of another pixel pattern.
Figure 4B:
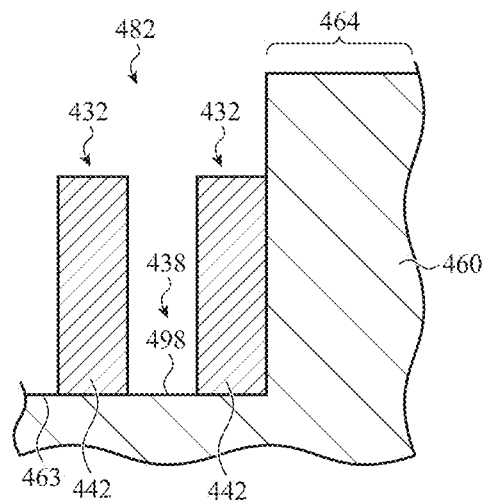
FIG. 4B shows a schematic cross-sectional view of the pixel pattern of FIG. 4A along line A-A according to one embodiment.
Figure 4C:
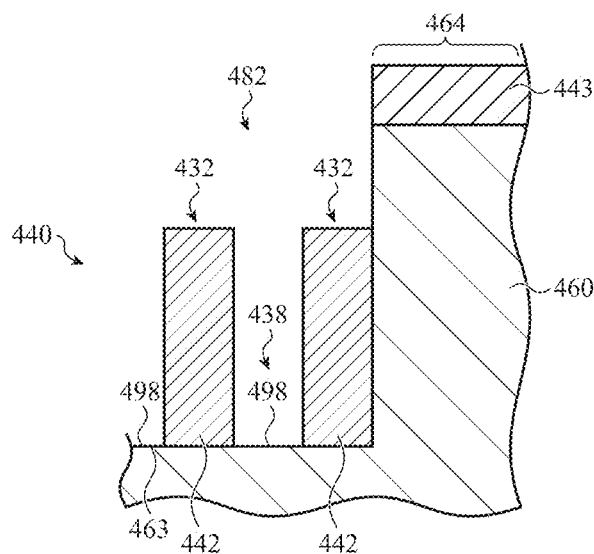
FIG. 4C shows a schematic cross-sectional view of the pixel pattern of FIG. 4A along line A-A according to another embodiment.

In some embodiments, the metallic substrate defines a recess and the metal oxide layer is formed within the recess, as shown in the cross-section views of FIGS. 4B-4C. In addition, the metallic substrate may optionally include another oxide layer formed outside the recess. FIG. 4A shows an example of a pixel pattern comprising a first pixel 432 and a second pixel 438. In the example pixel pattern 422 of FIG. 4A, first pixel 432 has a darker appearance than second pixel 438.

FIG. 4B is a cross-sectional view of the pixel pattern 422 of FIG. 4A. Substrate 460 defines recess 482 and recess surface 463 that is offset from or below the surrounding surface of the substrate 460. In some cases, the recess surface 463 is surrounded by a set of recess walls, which may extend between the recess surface 463 and the surrounding surface of the substrate 460. The surrounding portion of the substrate 460 further may include portion 464 that is adjacent the recess 482. Pixels 432 and 438 are located within recess 482 and formed along recess surface 463. In the example of FIG. 4B, first portion 442 of the metal oxide layer 440 defines first pixel 432. Second pixel 438 is defined by surface 498 of the metallic substrate below a void in the oxide layer.

FIG. 4C is an alternate cross-sectional view of the pixel pattern 422 of FIG. 4A. As in FIG. 4B, substrate 460 defines recess 482 having a recess surface 463 and metal oxide layer 440 is formed along recess surface 463. However, substrate 460 also includes another oxide layer 443 formed on portion 464 of substrate 460 adjacent the recess 482. In examples, oxide layer 443 may comprise a metal oxide and may be a native oxide layer, a thermally grown oxide layer, or an anodically grown oxide layer. For example, a native oxide layer may have a thickness less than 5 nm, less than 3 nm, or less than 2 nm and may produce little, if any, color effect.

Figure 5A:
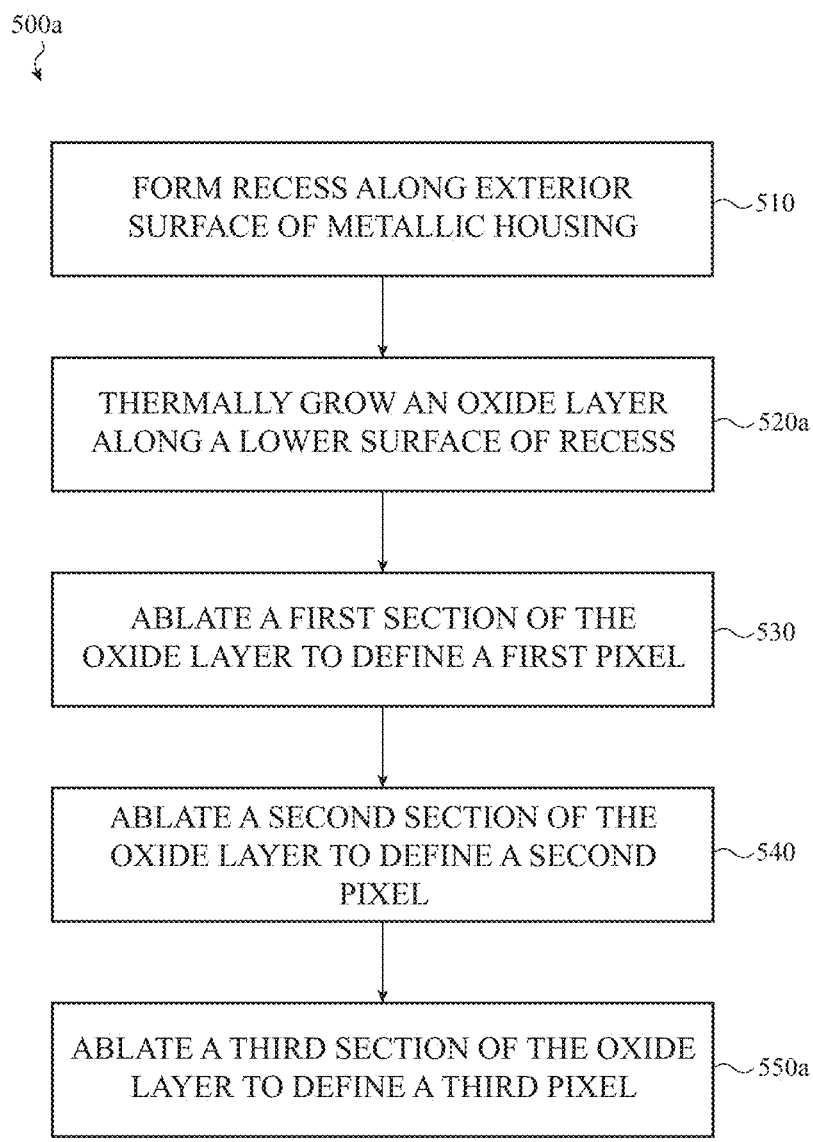
FIG. 5A shows a flowchart of a process for making a marking according to one embodiment.

FIG. 5A illustrates a flowchart of an example process 500a for forming an image along an exterior surface of a metallic housing or metallic component. Process 500a may be used to form an oxide layer having portions of different thicknesses to define pixels of the image. In embodiments, the first, second, and third pixels are formed independently of each other. For example, process 500*a* may be used to form the oxide layer structures and pixel patterns of FIGS. 2A-3B.

The process 500*a* may include step 510*a* of forming a recess along an exterior surface of a metallic housing, which may be optional in some embodiments. Similar to as described above with respect to FIGS. 4A-4C, above, and FIG. 6A, below, the recess may include a recess surface that is offset from the exterior surface of the metallic housing or metallic component. The recess surface may be surrounded by a set of recess walls that extend between the recess surface and the exterior or surrounding surface. The recess may be formed by exposing the metallic substrate to a beam from a first laser using a first laser-based process. The first laser may be a femtosecond laser producing pulses having an effective pulse duration in the femtosecond range. The laser may produce a wavelength in the near infrared range (e.g., with a wavelength from about 1 μm to about 5 μm). The pulse duration may be from about 200 fs to about 800 fs, the average power may be from about 1 W to about 15 W or from about 1 W to about 5 W. The repetition rate may be from about 50 kHz to about 750 kHz or 50 kHz to about 500 kHz. Additional embodiments may use faster or slower repetition rates. In some embodiments, the laser may be operated in burst mode, with each burst including multiple pulses. In embodiments, the number of pulses in the burst may be from 5 to 25. The scan speed may be from about 750 mm/sec to about 1500 mm/sec or from about 1000 mm/sec to about 1500 mm/sec. The number of passes from 1 to 30 or 1 to 25. The spot size may be from 10 μm to 50 μm. The hatch distance may be up to 15 μm. In other example processes step 510*a* may be omitted.

As shown in FIG. 5A, the process 500*a* further includes step 520*a* of thermally growing an oxide layer comprising a metal oxide along a surface of the metallic housing. In particular, the oxide layer may be grown along a surface of the recess formed in step 510*a*. As shown in FIG. 5A, at least one of the surfaces of the recess along which the oxide is grown may be at the bottom of the recess. The oxide layer may be grown by exposing the metallic substrate to a beam from a second laser using a second laser-based process. In embodiments, the oxide layer is grown using a second laser or set of laser parameters. The second laser may be a nanosecond laser producing pulses having an effective pulse duration in the nanosecond range. The laser may produce a wavelength in the near infrared range, the visible range, or in the ultraviolet range. The pulse duration may be from about 2 ns to about 500 ns and the average power may be from about 1 W to about 15 W. In embodiments, the repetition rate may be from about 100 kHz to about 750 kHz or from about 100 kHz to about 500 kHz. Additional embodiments may use faster or slower repetition rates. In some embodiments, the laser may be operated in burst mode, with each burst including multiple pulses. In embodiments, the number of pulses in the burst may be from 5 to 25. The scan speed may be from about 100 mm/sec to about 2000 mm/sec or from about 100 mm/sec to about 800 mm/sec. The number of passes may be from 1 to 15 or 2 to 20. The spot size may be from about 10 μm to about 50 μm. The hatch distance may be up to about 50 μm, or from about 10 μm to about 30 μm. In embodiments, the hatch distance may be less, approximately equal to, or greater than the spot size.

Figure 5B:
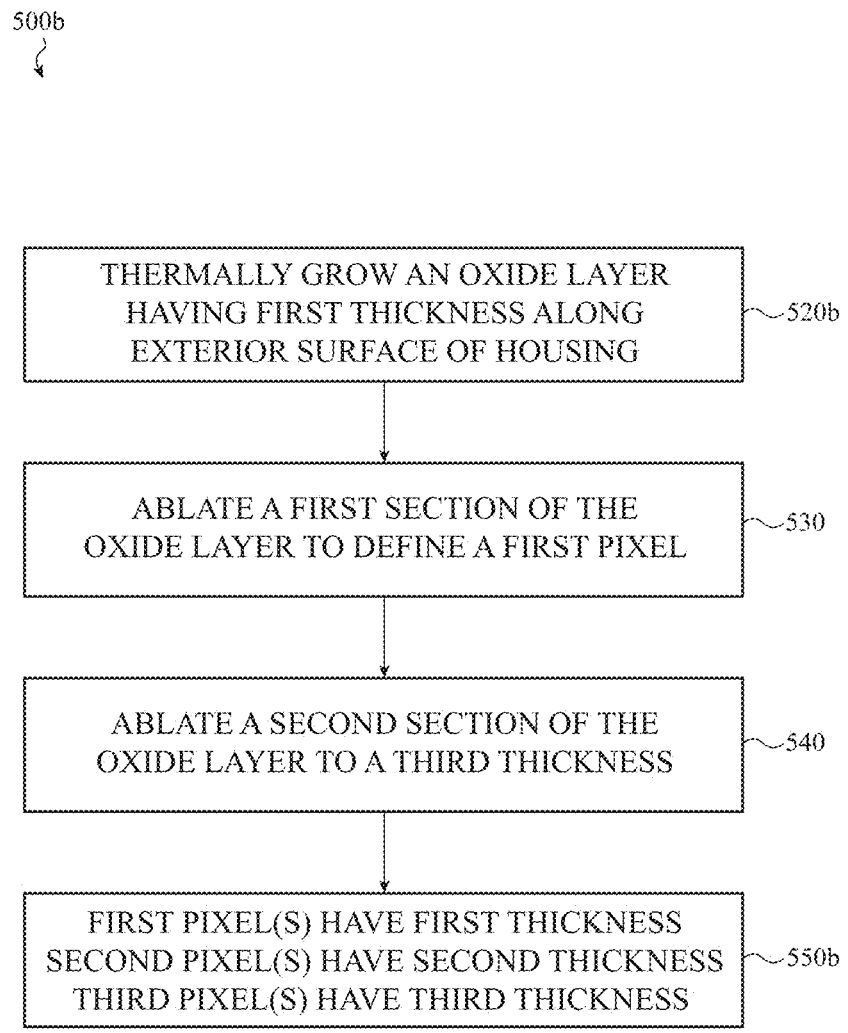
FIG. 5B shows a flowchart of a process for making a marking according to an additional embodiment.

As depicted in FIG. 5A, an image is formed in the oxide layer by steps 530*a*, 540*a*, and 550*a*, which respectively form a first, a second, and a third pixel. In step 530*a*, a first section of the oxide layer is ablated to define a first pixel having a first thickness (or thickness range) and a first color; a third laser-based process may be used. In further embodiments, step 520*a* may define a first set of pixels having the first color and the first thickness or thickness range. In additional embodiments, three different types of pixels may be formed in fewer than three ablation steps, as indicated by FIG. 5B.

In step 540*a*, a second section of the oxide layer is ablated to define a second pixel having a second thickness (or thickness range) and a second color. A fourth laser-based process may be used. The second section may be different than the first section.

In step 550*a*, a third section of the oxide layer is ablated to define a third pixel having a third thickness (or thickness range) and a third color. A fifth laser-based process may be used. The third section may be different than the first section and the second section.

In embodiments, each of the third laser-based process, the fourth laser-based process, and the fifth laser-based process use a femtosecond laser producing pulses having an effective pulse duration in the femtosecond range. The laser may produce a wavelength in the near infrared range (e.g., with a wavelength from about 1 μm to about 5 μm). The pulse duration may be from about 200 fs to about 800 fs, the average power may be from about 0.05 W to about 0.5 W or from 0.05 W to about 5 W. The repetition rate may be from about 10 kHz to about 50 kHz. Additional embodiments may use faster or slower repetition rates. In embodiments, the average power divided by the repetition rate may be less than that used in step 520*a*. In some embodiments, the laser may be operated in burst mode, with each burst including multiple pulses. In embodiments, the number of pulses in the burst may be from 5 to 25. The scan speed may be from about 700 mm/sec to 1300 mm/sec. The number of passes may be from 1 to 8. The spot size may be from 10 μm to 50 μm. The hatch distance may be less than the spot size, and may be from about 5 μm to about 30 μm. In embodiments, the hatch distance may be less, approximately equal to, or greater than the spot size.

In additional embodiments, the process 500*a* optionally comprises forming a pixel having a metallic color by ablating the oxide layer to substantially remove it from the metallic substrate. The metallic color may contribute provide a lighter tone for a monochromatic (e.g., grayscale) image. The metallic color may be characterized by a reflectivity as well as a color. The metallic substrate may be polished after ablating the oxide layer in a similar fashion as described for operation 920 of process 900. In some embodiments, a steel or titanium substrate may be given the appearance of a metal such as silver, palladium, platinum, or gold. In additional embodiments, the process comprises forming a pixel having diffraction features which provide a structural color through diffraction of light.

FIG. 5B illustrates a flowchart of an example process 500*b* for forming an image along an exterior surface of a metallic housing or metallic component. Process 500*b* may be used to form an oxide layer having portions of different thicknesses to define pixels of the image. At least some of the pixels are formed through the cumulative effect of multiple laser-based ablation processes. For example, process 500*b* may be used to form the oxide layer structures and pixel patterns of FIGS. 2A-3B.

As shown in FIG. 5B, process 500*b* includes step 520*b* of thermally growing an oxide layer comprising a metal oxide along an exterior surface of the metallic housing. In embodiments, the oxide layer has a first thickness or thickness range after step 520*b*. In some embodiments, the oxide layer may be grown along a surface of a recess as previously described for FIG. 5A and shown in FIG. 6B. The oxide layer may be grown by exposing the metallic housing to a beam from a first laser using a first laser-based process. The process conditions of the first laser-based process may be similar to those described for step 520a of process 500a.

Process 500b further includes step 530b of ablating a first section of the oxide layer to define a second thickness or thickness range. Typically the first section is sized so that the oxide layer after step 530b has two different thicknesses (e.g., the first section is less than the entire oxide layer). A second laser-based process may be used and the process conditions may be similar to the those described for step 530a of process 500a. FIG. 6C shows an example of the oxide layer after step 530b.

Process 500b further includes step 540b of ablating a second section of the oxide layer to define a second thickness or thickness range and a second color. Typically the second section is sized so that the resulting oxide layer has three different thicknesses. In embodiments, the second section may be located within the first section of the oxide layer so that the effect of the second and the third laser-based process are cumulative, as illustrated by FIG. 6D. A third laser-based process may be used and the process conditions may be similar to those described for step 540a of process 500a.

The combined effect of laser ablation steps 530b and 540b is to produce an oxide layer having a three different thicknesses. As indicated by step 550b, the first pixel(s) may be located in portions of the oxide layer having the first thickness, the second pixel(s) may be located in portions of the oxide layer having the second thickness, and the third pixel(s) may be located in portions of the oxide layer having the third thickness.

FIGS. 6A, 6B, 6C and 6D schematically illustrate four stages in an example process for making an image comprising multiple pixels on an exterior surface of a metallic housing. The process forms an oxide layer having portions of different thicknesses to define pixels of the image. The example process may follow the steps shown in FIG. 5B, with the inclusion of an additional step of forming a recess in the metallic substrate.

Figure 6A:
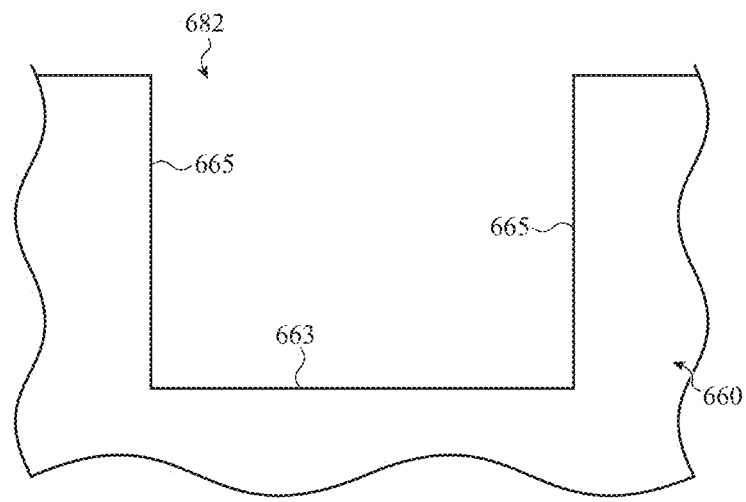
FIGS. 6A, 6B, 6C, and 6D schematically illustrate stages in an example process for making a marking.

FIG. 6A shows a metallic substrate after formation of an example recess as in step 510a of FIG. 5A. The cross-sectional view of FIG. 6A shows formation of a recess 682 in metallic substrate 660. The recess 682 has a recess surface 663 that is surrounded by a set of recess walls 665. The recess 682 may be formed by ablating the metallic substrate using laser pulses having an effective pulse duration in the femtosecond range as described for step 510a of FIG. 5A.

Figure 6B:
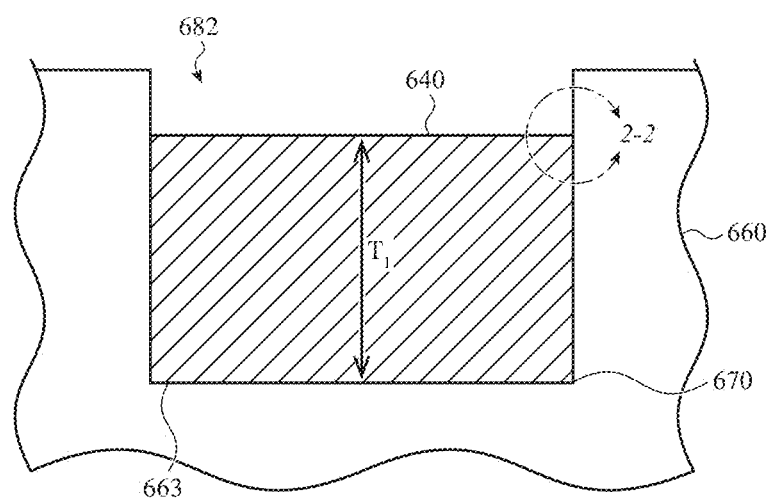
Figure 6C:
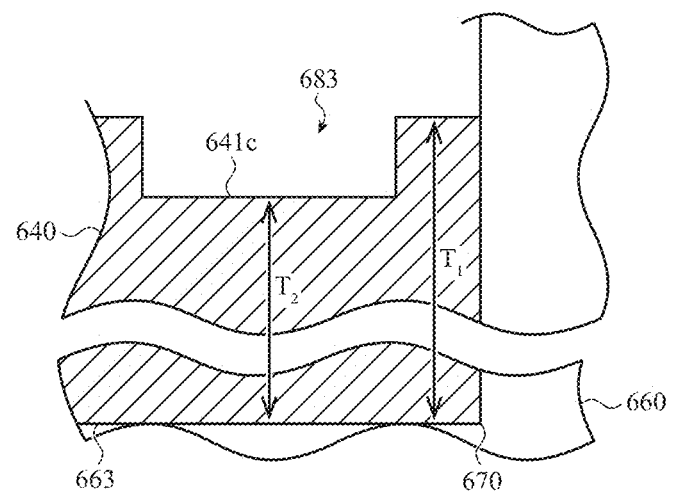
Figure 6D:
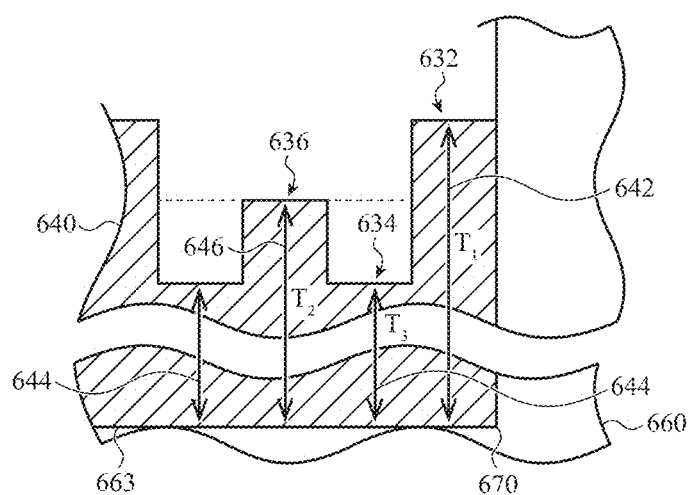

FIG. 6B shows an oxide film and metallic substrate after an example thermal oxide growth step as in step 520a of FIG. 5A. The cross-sectional view of FIG. 6B shows oxide layer 640 as thermally grown within recess 682 along recess surface 663. While the oxide layer 640 is depicted as substantially covering the recess surface 663, it is not necessary. For example, the oxide layer 640 may be formed over a portion of the recess surface 663. As shown in FIG. 6B, the oxide layer 640 has a thickness T1 and forms interface 670 with metallic substrate 660. The position of recess surface 663 may be deeper in the metallic substrate 660 than shown in FIG. 6A when the oxide layer 640 grows into the metallic substrate 660. In embodiments, the oxide layer 640 may be thermally grown from the metallic substrate using laser pulses having an effective pulse duration in the nanosecond range as described for step 520a of FIG. 5A.

For simplicity, the oxide layer 640 is depicted in FIG. 6B as having a uniform thickness. However, in additional embodiments the oxide layer 640 may vary in thickness. For example, the thickness of the oxide layer may vary, in part, due to a variation in intensity of the laser beam with distance from the center of the beam. In addition, an overlap between areas of the metallic substrate exposed to the laser beam (e.g., as determined by the hatch distance) may also lead, in part, to variation in the thickness of the oxide layer. In some embodiments, the oxide layer 640 may be ablated with a laser-based process to obtain a layer of more uniform or substantially uniform thickness $T_1$ following thermal growth of the oxide layer 640.

FIG. 6C illustrates an oxide film after an example first ablation step as in step 530b of FIG. 5B. To obtain the oxide film shown in FIG. 6C, a section of the oxide layer 640 of FIG. 6B is removed to form recess 683. A remaining portion 641c of the oxide layer 640 under recess 683 has thickness $T_2$. In embodiments, the section of the oxide layer 640 is ablated using laser pulses having an effective pulse duration in the femtosecond range as described for step 530b of FIG. 5B. For similar reasons as previously described for FIG. 6B, portion 641c of the oxide layer 640 is depicted in FIG. 6C as having a uniform thickness but in additional embodiments portion 641c of the oxide layer 640 may vary in thickness.

FIG. 6D illustrates an oxide film after an example second ablation step as in step 540b of FIG. 5B. After the second ablation step, the oxide film has three different thicknesses. In particular, portion 642 has thickness $T_1$, portion 644 has thickness $T_2$, and portion 646 has thickness $T_3$. Portion 642 may be viewed as a remaining portion of oxide layer 640 as shown in FIG. 6B.

As schematically shown in FIG. 6D, a first pixel 632 is defined by portion 642. The thickness $T_1$ of portion 642 may define, in part, a first color of first pixel 632. A second pixel 636 is defined by portion 646. The thickness $T_2$ of portion 646 may define, in part, a second color of second pixel 636. A third pixel 634 is defined by portion 644. The thickness $T_3$ of portion 644 may define, in part, a third color of third pixel 634.

To obtain the oxide film shown in FIG. 6D, additional sections of the remaining portion 641c of FIG. 6C are removed during a laser ablation step. In embodiments, additional sections of the remaining portion 641c of FIG. 6C are selectively removed using laser pulses having an effective pulse duration in the femtosecond range as described for step 540b of FIG. 5B.

During the operation of removing sections of the oxide layer 640 in steps 530b and 540b, a particular location of the oxide layer 640 may be exposed to one or more passes of a laser. For example, a location at which relatively more oxide material is to be removed may be exposed to multiple passes of the laser. Portions 642, 644 and 646 of the oxide layer 640 are depicted in FIG. 6D as having a substantially uniform thickness but in additional embodiments may vary in thickness for similar reasons as previously described for FIG. 6B. In addition, portions 642, 644 and 646 of the oxide layer 640 are shown as being uniform in width, but this depiction is illustrative rather than limiting.

In additional embodiments, the image of FIG. 1A may be formed using an oxide layer comprising different metal oxides anodically grown on a metallic substrate of an electronic device housing. The different metal oxides may define pixels having different colors. In some embodiments, a size of the pixels is larger than the spot size of the laser. For example, a smallest width of the pixel may be up to 500 µm, up to 1 mm, or up to 5 mm.

For example, the image may include a set of pixels comprising a first pixel having a first color and defined by a first metal oxide anodically grown on a first portion of the metallic substrate and a second pixel having a second color and defined by a second metal oxide anodically grown on a second portion of the metallic substrate. The first portion of the metallic substrate may be adjacent the second portion. The different metal oxides defining the pixels may be grown in one or more anodization processes as described herein. FIGS. 7A-8D show several ways to produce patterns of pixels similar to those shown in FIG. 1B using an oxide layer comprising different metal oxides.

Several factors may contribute to the appearance of a given pixel. A porous metal oxide may include a colorant, such as a dye or pigment, in the pores to obtain a desired color. The pore structure of the metal oxide may affect the uptake of dye into the oxide. Even in the absence of a colorant, the metal oxide may have a color due to its composition and/or structure. For example, the brightness of a pixel may be affected by the amount of light reflected from a top surface of the metal oxide defining the pixel. When the metal oxide is sufficiently transparent or translucent, the roughness at the interface between the metal oxide layer and the metallic substrate may also affect the amount of light reflected from the interface. A thickness of the metal oxide may also influence the color of the pixel.

Figure 7A:
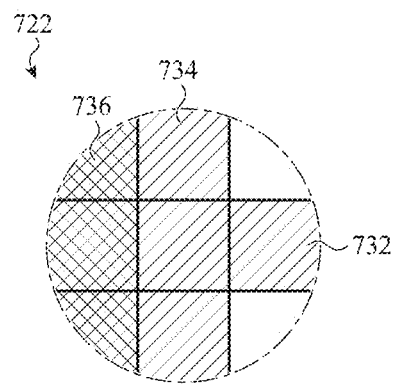
FIG. 7A is a schematic top view of a pixel pattern.

FIG. 7A is a schematic top view of a pixel pattern 722 produced using an oxide layer including three different oxide materials. The three different oxide materials are formed in a single anodization process. Different oxide materials formed in a single anodization process may have substantially the same composition, but may differ in appearance due to a variety of factors. The pattern comprises pixels 732, 734, and 736, each of which has a different color and is associated with a different oxide material. In the example pixel pattern 722 of FIG. 7A, pixel 736 has a darker appearance than pixel 734, which in turn has a darker appearance than pixel 732.

Figure 7B:
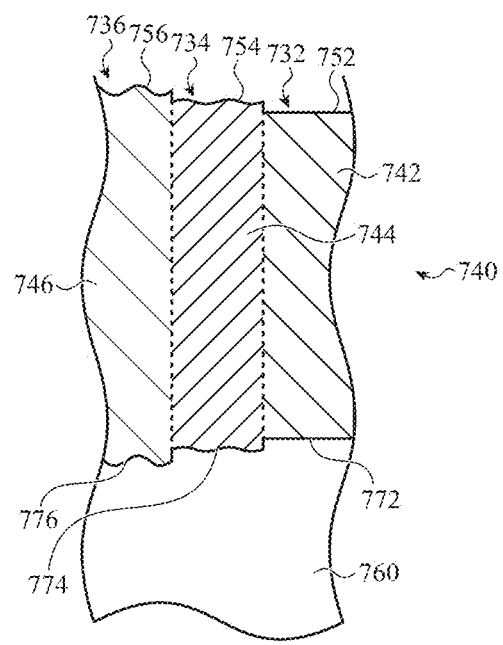
FIG. 7B shows a schematic cross-sectional view of the pixel pattern of FIG. 7A according to one embodiment.

FIG. 7B is a cross-sectional view of the pixel pattern 722 of FIG. 7A. As depicted, oxide layer 740 is disposed on metallic substrate 760 and includes first metal oxide 742, second metal oxide 744, and third metal oxide 746. First pixel 732, second pixel 734, and third pixel 736 are respectively located at the positions of first metal oxide 742, second metal oxide 744 and third metal oxide 746. A pixel may be defined at least in part by the metal oxide present at the location of the pixel. For example, first pixel 732 is defined by first metal oxide 742, second pixel 734 is defined by second metal oxide 744, and third pixel 736 is defined by third metal oxide 746.

Because the first metal oxide 742, second metal oxide 744, and third metal oxide 746 are formed in a single anodization step, these metal oxides are not typically dyed with different pigments to produce different pixel colors. In embodiments, the first metal oxide 742, second metal oxide 744 and third metal oxide 746 are dyed with the same dye or pigment. As a non-limiting example, FIG. 7B schematically shows these metal oxides as having differences in surface and interface roughness which may contribute to differences in reflectance and pixel brightness. For example, surfaces 756, 754, and 752 are shown as having different surface textures, with surface 756 being the roughest and surface 752 being the smoothest. The differences in roughness of the surface of the metal oxides may contribute to differences in the amount of light reflected from these surfaces. As an example, a rougher surface may lead to decreased reflection of light from the surface. The roughness of the surfaces 756, 754, and 752 may be due in part to the roughness or texture of the interfaces 776, 774, and 772. As explained in more detail below with respect to FIG. 9 and FIGS. 10A-10D, the roughness of the interfaces 776, 774, and 772 may be controlled or formed using one or more laser-polishing steps.

In addition, the different roughness or textures of the interfaces 776, 774, and 772 may lead to differences in reflection of light along the interface. In particular, interface 776 is schematically shown as having a texture that may reflect a lesser amount of light than that of interface 774. Similarly, interface 774 is schematically shown as having a texture that may reflect a lesser amount of light than that of interface 772. Differences in the amount of light reflected from interfaces 776, 774, and 772 can therefore also contribute to different levels of brightness for pixels 736, 734, and 732. Such an effect is consistent with the pattern shown in FIG. 7A, where pixel 736 is the darkest and pixel 732 the brightest.

When the first metal oxide 742, the second metal oxide 744, and the third metal oxide 746 are formed in a single anodization process, interfaces 772, 774, and 776 may be at similar depths in substrate 760 as shown in FIG. 7B. In embodiments, the metal oxide layer 740 has a thickness from about 10 μm to about 50 μm. The first metal oxide 742, the second metal oxide 744, and the third metal oxide 746 may have substantially the same thickness or may differ in thickness.

Figure 8A:
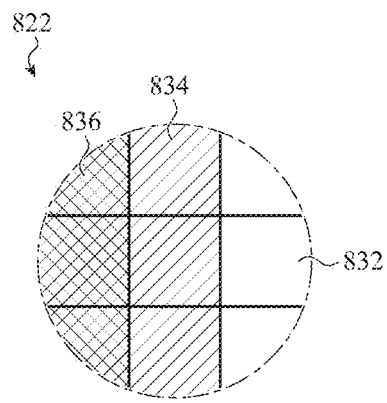
FIG. 8A is a schematic top view of another pixel pattern.

FIG. 8A is a schematic top view of another pixel pattern 822 produced using an oxide layer including three different oxide materials. In this example, the oxide layer is grown in two separate anodization processes. The pattern comprises pixels 832, 834, and 836, each of which has a different color.

Figure 8B:
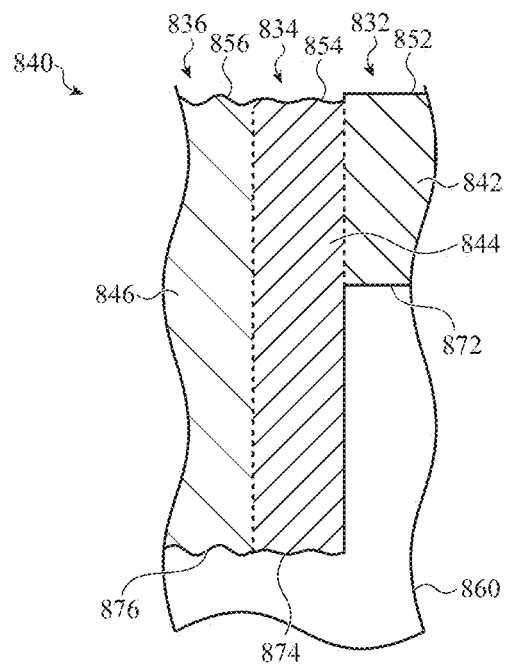
FIG. 8B shows a schematic cross-sectional view of the pixel pattern of FIG. 8A according to one embodiment.

FIG. 8B is a cross-sectional view of the pixel pattern 822 of FIG. 8A. As depicted, oxide layer 840 is disposed on a metallic substrate 860 and comprises a first metal oxide 842, a second metal oxide 844, and a third metal oxide 846. As explained further below, the first metal oxide 842 is formed by a first anodization process and the second and the third metal oxides 844, 846 are formed during a second anodization process.

First pixel 832 is located at the position of, and is defined by, first metal oxide 842. Similarly, second pixel 834 is located at the position of, and is defined by, second metal oxide 844, and third pixel 836 is located at the position of, and is defined by, third metal oxide 846. Differences in the appearance of different pixels may be due to differences in one or more of oxide compositions, colorants, pore structures, interface texture, and oxide thickness. For example, pixel 832 may have a first hue due, in part, to incorporation of a first dye into the first metal oxide 842. Pixels 834 and 836 may have a second hue different from the first hue due, in part, to incorporation of a second dye different from the first dye into the second and third metal oxides 844, 846. Further, pixel 834 may have a different value (e.g., brightness) than pixel 836.

The first metal oxide 842 defines surface 852 of the first metal oxide 842 and forms interface 872 with the metallic substrate. The second metal oxide 844 defines surface 854 and forms interface 874 with the metallic substrate 860. Similarly, third metal oxide 846 defines surface 856 and interface 876 with the metallic substrate 860. Interfaces 874 and 876 are at a different height than interface 872. In particular, interfaces 874 and 876 are located deeper in the metallic substrate 860 than interface 872 because they were formed during a second anodization process. In addition, interface 876 is shown as having a rougher texture than interface 874, which may lead to a lower amount of light reflected from the interface 876 and a reduced brightness.

The structure of FIG. 8B may be formed when a layer of first metal oxide 842 is grown in a first anodization process and then ablated to expose a first portion of the metallic substrate 860. The first portion of the metallic substrate 860 may be laser polished before growing the second metal oxide 844 and the third metal oxide 846 in a second anodization process, as explained further with respect to FIGS. 10A-10D.

As shown in FIG. 8B, the second metal oxide 844 and the third metal oxide 846 have a thickness substantially greater than the first metal oxide 842 as a result of growth of the second metal oxide 844 and third metal oxide 846 downward into the metallic substrate 860 during the second anodization process. In embodiments, first metal oxide 842 has a thickness from about 10 μm to about 20 μm while second metal oxide 844 and third metal oxide 846 each have a thickness from about 10 μm to about 50 μm. Although for convenience the second metal oxide 844 and the third metal oxide 846 are shown as having substantially the same thickness, this example is not intended to be limiting. In addition, although interface portions 874 and 876 are shown as being at substantially the same depth in the metallic substrate 860, this example is also not intended to be limiting. In additional embodiments, a portion of second metal oxide 844 may extend under first metal oxide 842 due to outward as well as downward growth of second metal oxide 844 into the metallic substrate 860 during the second anodization process.

Figure 8C:
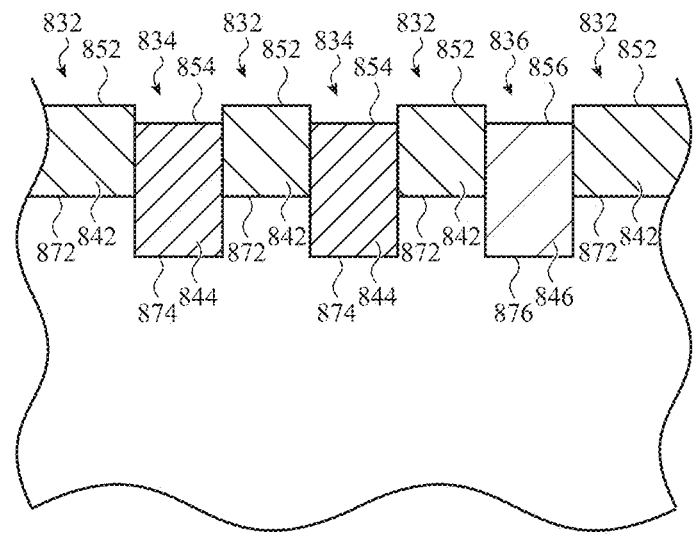
FIG. 8C shows a schematic cross-sectional view of a sample portion of an image.

FIG. 8C illustrates a cross-sectional view of another image produced using an oxide layer including three different oxide materials. In the example shown in FIG. 8C, each of the different oxide materials is formed in a separate anodization process. The pattern comprises pixels 832, 834, and 836, each of which has a different appearance and is associated with a different oxide material.

In embodiments, pixels 832, 834, and 836 each have a different color. For example, pixel 832 may have a first hue due, in part, to incorporation of a first dye or pigment into the first metal oxide 842. Pixel 834 may have a second hue different from the first hue due, in part, to incorporation of a second dye or pigment different from the first dye into the second metal oxide 844. Further, pixel 836 may have a third hue different from the first and second hues due, in part, to incorporation of a third dye or pigment different from the first and second dyes into the third metal oxide 846.

The structure of FIG. 8C may be formed when a layer of first metal oxide 842 is grown in a first anodization process and then dyed to produce a first color and sealed. A first section of the first metal oxide 842 may be ablated using a first laser-based process to expose a first portion of the metallic substrate; the first portion of the metallic substrate may be polished to produce a first polished region using a second laser-based process. A second metal oxide 844 is then grown along the first polished region in a second anodization process, dyed to produce a second color, then sealed. A second section of the first metal oxide 842 is ablated using a third laser-based process to expose a second portion of the metallic substrate. The second portion of the metallic substrate may be polished to produce a second polished region using a fourth laser-based process. A third metal oxide 846 is then grown along the second polished region in a third anodization process, dyed to produce a third color, then sealed.

In the example of FIG. 8C, the first metal oxide 842 defines surface 852 of the first metal oxide 842 and forms interface 872 with the metallic substrate. The second metal oxide 844 defines surface 854 and forms interface 874 with the metallic substrate. Similarly, third metal oxide 846 defines surface 856 and interface 876 with the metallic substrate. Interfaces 874 and 876 are at a different height than interface 872. In particular, interfaces 874 and 876 are located deeper in the substrate than interface 872.

A structure with four metal oxides may be grown similarly, with ablation of a first section of the first metal oxide allowing for growth of a second metal oxide, ablation of a second section of the first metal oxide allowing for growth of a third metal oxide, and ablation of a third section of the first metal oxide allowing for growth of a fourth metal oxide. As an example, the first metal oxide may not be dyed but may be sealed, the second metal oxide may be dyed to have a cyan hue, the third metal oxide may be dyed to have a magenta hue, and the fourth metal oxide may be dyed to have a yellow hue.

Figure 8D:
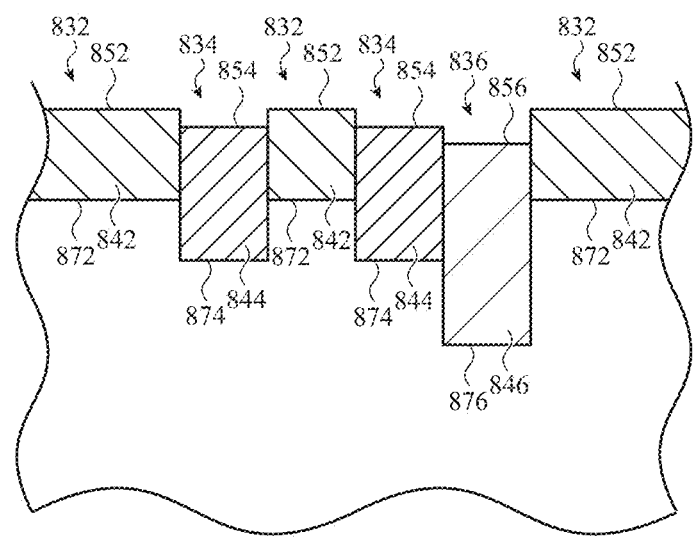
FIG. 8D shows a schematic cross-sectional view of another sample portion of an image.

FIG. 8D illustrates a cross-sectional view of another example image or pixel array produced using an oxide layer including three different oxide materials. In the example of FIG. 8D, each of the different oxide materials is formed in a separate anodization process. The pattern of pixels comprises pixels 832, 834, and 836, each of which has a different color and is associated with a different oxide material.

With respect to FIG. 8D, pixel 832 may have a first hue due, in part, to incorporation of a first dye into the first metal oxide 842. Pixel 834 may have a second hue different from the first hue due, in part, to incorporation of a second dye different from the first dye into the second metal oxide 844. Further, pixel 836 may have a third hue different from the first and second hues due, in part, to incorporation of a third dye different from the first and second dyes into the third metal oxide 846.

The structure of FIG. 8D may be formed when a layer of first metal oxide 842 is grown in a first anodization process, dyed to produce a second color, and then sealed. A section of first metal oxide 842 may be ablated using a first laser-based process to expose a first portion of the metallic substrate. The first portion of the metallic substrate may be polished to produce a first polished region using a second laser-based process. A second metal oxide 844 is then grown along the first polished region in a second anodization process, dyed to produce a second color, then sealed. A section of the second metal oxide 844 may be ablated using a third laser-based process to expose a second portion of the metallic substrate. The second portion of the metallic substrate may be polished to produce a second polished region using a fourth laser-based process. A third metal oxide 846 is then grown along the second polished region in a third anodization process, dyed to produce a third color, then sealed.

In the example of FIG. 8D, the first metal oxide 842 defines surface 852 of the first metal oxide 842 and forms interface 872 with the metallic substrate. The second metal oxide 844 defines surface 854 and forms interface 874 with the metallic substrate. Similarly, third metal oxide 846 defines surface 856 and interface 876 with the metallic substrate. Interfaces 874 and 876 are at a different height than interface 872. In particular, interface 874 is located deeper in the substrate than interface 872 and interface 876 is located deeper in the substrate than interface 874 due to the sequence of process steps.

A structure with four metal oxides may be grown similarly, by ablating a portion of the third metal oxide to expose a third portion of the metallic substrate. Alternately, an additional portion of the first or second metal oxide may be ablated to expose a third portion of the metallic substrate. As an example, the first metal oxide may not be dyed but may be sealed, the second metal oxide may be dyed to have a cyan hue, the third metal oxide may be dyed to have a magenta hue, and the fourth metal oxide may be dyed to have a yellow hue.

Figure 9:
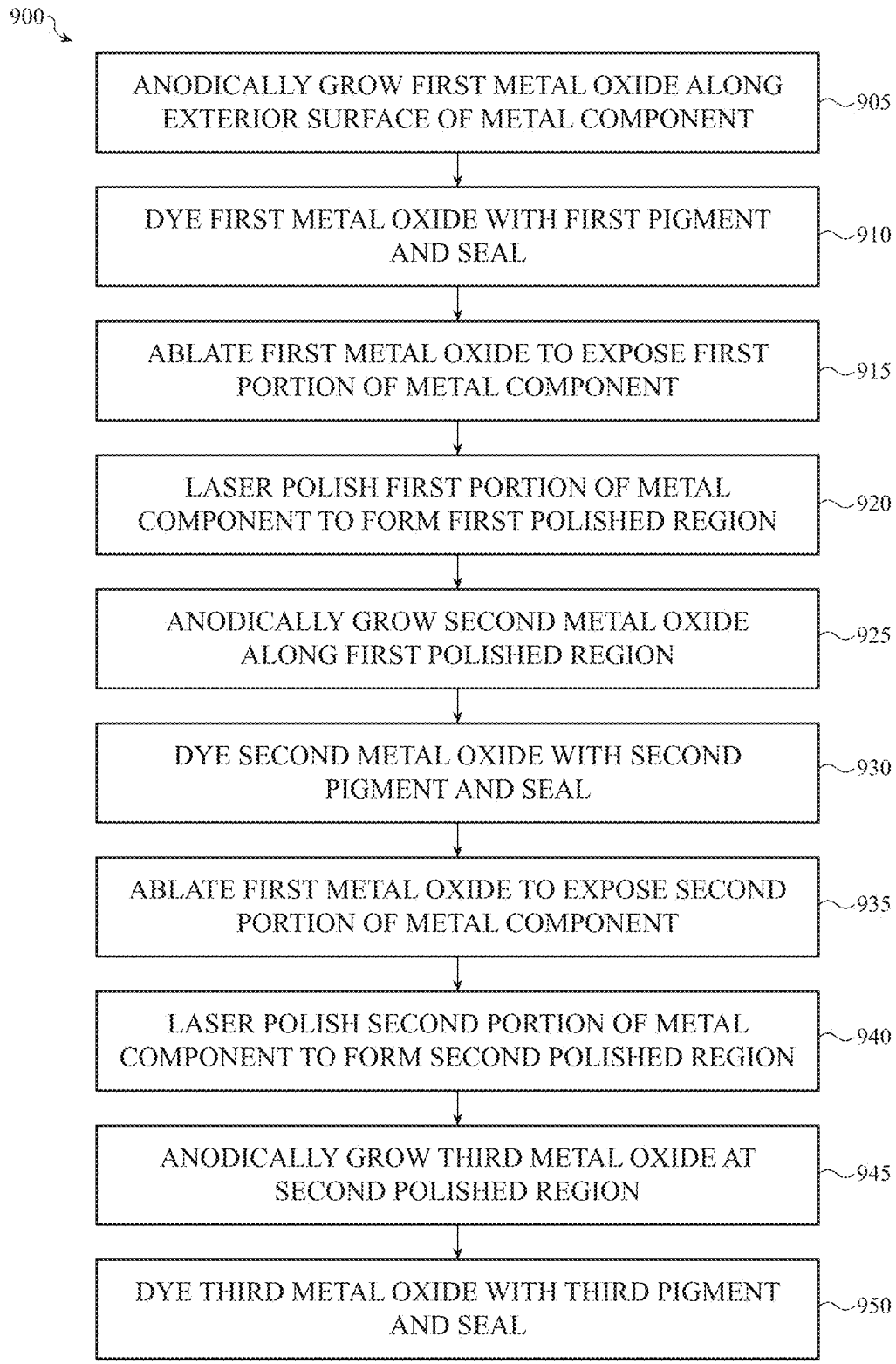
FIG. 9 shows a flowchart of another example process for making a marking.

FIG. 9 illustrates a flowchart of an example process 900 for making a marking comprising multiple pixels. Process 900 forms an oxide layer comprising different metal oxides to define pixels of the image. For example, process 900 may be used to form the oxide layer structures and pixel patterns of FIGS. 8C-8D. In some embodiments, certain steps (e.g., the formation of a third metal oxide) may be omitted to form pixel patterns similar to the examples of FIGS. 7A-8B. In addition, a dying step such as step 910, 930, or 950 may be omitted if desired.

In step 905 a first metal oxide is anodically grown along an exterior surface of a metal component. In some cases, the first metal oxide is grown on the metal component through anodic oxidation. Anodic oxidation is an electrochemical process which may also be referred to as anodization. The first metal oxide may be in the form of a layer.

In some embodiments, the first metal oxide is grown using a bath comprising an acid. For aluminum alloy components, suitable acids include, but are not limited to, sulfuric acid ($H_2SO_4$). For aluminum alloy components, an aluminum oxide layer may be grown under standard conditions or under "hard" conditions. The thickness of the coating and the extent and structure of the pores may depend on the anodization process. For example, "standard" (e.g., Type II) anodization conditions may produce metal oxide layers having more porosity and higher extent of ordering of the pores than "hard" (e.g., Type III) anodization conditions. During standard anodization conditions the bath may be maintained at about room temperature. For example, the bath may be maintained between about 18 and 22 degrees Celsius. During hard anodizing conditions the aluminum oxide is grown at a lower temperature and a higher voltage than standard anodization conditions. For example, the temperature of the bath may be about 0 degrees Celsius and the voltage range may be up to about 5 times the voltage of standard anodization conditions.

In step 910, the first metal oxide is dyed using a first pigment to produce a first color and sealed. A porous metal oxide may be dyed to impart a color to the metal oxide. For example, a dye or pigment may be incorporated in the metal oxide to a depth from 3 μm to 10 μm. The metal oxide may be dyed by immersion in a heated dye bath. After dyeing, pores of the metal oxide layer may be sealed by immersion in a sealing bath. The bath may be, for example, heated (e.g., boiling) water or a solution of nickel acetate. Immersion of metal oxide in the bath may form a metal hydroxide. In some embodiments, a metal oxide may be sealed without being dyed and step 910 may be omitted.

In step 915, the first metal oxide is ablated to expose a first portion of the metal component using a first laser-based process. A remaining portion of the first metal oxide defines a first pixel having a first color. In embodiments, ablating the first metal oxide using the first laser-based process does not substantially engrave the metallic substrate. For example, the exposed portion of the metallic substrate may be recessed by 5 μm or less, 3 μm or less, 2 μm or less, or 1 μm or less with respect to an interface between the first metal oxide and the metallic substrate.

The first laser-based process may use a first laser. For example, the first laser may be a femtosecond laser producing pulses having an effective pulse duration in the femtosecond range. At this stage, the exposed portion of the metallic substrate may have a first texture comprising a first roughness. One measure of surface roughness is the parameter Ra which is a measure of the amplitude of the roughness profile (arithmetic average value of roughness determined from deviations about a center line). Another parameter is Sm, which is the mean spacing between peaks in the roughness profile. Reflectance may also be used as a measure of surface roughness. The laser may produce a wavelength in the near infrared range (e.g., with a wavelength from about 1 μm to about 5 μm). The pulse duration may be from 200 fs to 800 fs, the average power may be from about 1.5 W to about 5 W, and the repetition rate may be from about 50 kHz to about 200 kHz. Additional embodiments may use faster or slower repetition rates. In some embodiments, the laser may be operated in burst mode, with each burst including multiple pulses. The scan speed may be from about 800 mm/sec to about 1200 mm/sec and the number of passes from 1 to 5. The spot size may be from about 10 μm to about 50 μm. The hatch distance may be up to 10 μm, In step 920, the first portion of the metal component is laser polished to form a first polished region using a second laser-based process. In some implementations, step 920 is optional. In embodiments, the second laser-based process comprises exposing the first portion of the metallic substrate to a beam from a second laser to form a second texture and exposing the first portion of the metallic substrate to a beam from a third laser to form a third texture in the first laser polished region. The second texture may have a second roughness and the third texture may have a third roughness. The operation of laser polishing the first portion of the metal component may comprise at least partial melting of the surface features of the first and/or the second texture. The third roughness may therefore be less than the first roughness. In embodiments, the laser polishing may produce a texture having a roughness Ra from about 1 μm to about 2 μm. In some embodiments, the surface texture produced by the laser polishing may be characterized by the reflectance of the textured surface for a given wavelength of light or over a given range of wavelengths. In some embodiments, the surface texture produced by the laser polishing may be characterized by the reflectance of the textured surface for a given wavelength of light or over a given range of wavelengths.

In embodiments, the second laser-based process may further comprise production of one or more structures or features on the surface of the metal component. For example, the structures produced during laser polishing may be macrostructures, microstructures, nanostructures or a combination thereof. Further, the structures or features may be random or periodic. In some embodiments, the structures may produce a structural color through diffraction. Laser induced periodic surface structures (LIPSS) are examples of periodic structures having the appearance of waves or ripples. For example, a periodic structure may be formed to give an overlying portion of the metal oxide an apparent color. In some embodiments, an interface may comprise ripple features. In some embodiments, a steel or titanium substrate may be given the appearance of a metal such as silver, palladium, platinum, or gold.

The second laser may be a femtosecond laser producing pulses having an effective pulse duration in the femtosecond range. In some embodiments, the second laser operates at an average power lower than the first laser. For example, the average power of second laser may be from about 0.01 W to about 1.0 W. In additional embodiments, the average power may be from about 1 W to about 15 W. The second laser may be the same piece of equipment as the first laser but operated under different conditions. The laser may produce a wavelength in the near infrared range (e.g., with a wavelength from about 1 µm to about 5 µm). The pulse duration may be from about 200 fs to about 800 fs and the repetition rate may be from about 50 kHz to about 750 kHz or from about 100 kHz to about 300 kHz. Additional embodiments may use faster or slower repetition rates. In some embodiments, the laser may be operated in burst mode, with each burst including multiple pulses. In embodiments, the number of pulses in the burst may be from 5 to 25. The scan speed may be from about 800 mm/sec to about 1200 mm/sec, and the number of passes from 1 to 5. The spot size may be from about 10 µm to about 50 µm. The hatch distance may be up to 15 µm The third laser may be a nanosecond laser producing pulses having an effective pulse duration in the nanosecond range. The laser may produce a wavelength in the near infrared range. The pulse duration may be from about 2 ns to about 300 ns or from about 100 ns to about 400 ns. The average power may be from about 1 W to about 15 W or from about 4 W to about 15 W. The repetition rate may be about 50 kHz to about 500 kHz. Additional embodiments may use faster or slower repetition rates. In some embodiments, the laser may be operated in burst mode, with each burst including multiple pulses. In embodiments, the number of pulses in the burst may be from 5 to 25. The scan speed may be from about 200 mm/sec to about 2000 mm/sec or from about 200 mm/sec to about 800 mm/sec, and the number of passes from 1 to 10. The spot size may be from about 10 µm to about 50 µm. The hatch distance may be from about 10 µm to about 30 µm.

In step 925, a second metal oxide is anodically grown along the first polished region. For example, the second metal oxide is grown as described in step 905. The thickness of the second metal oxide may be selected so that the surface of the second metal oxide is recessed with respect to the surface of the first metal oxide, is substantially flush with the surface of the first metal oxide, or projects with respect to the surface of the first metal oxide.

In step 930, the second metal oxide is dyed using a second pigment to produce a second color and sealed. The second color is different than the first color. The second metal oxide may be dyed and sealed as previously described at step 910.

In step 935, the first metal oxide is ablated to expose a second portion of the metal component using a third laser-based process. The third laser-based process may use similar process conditions to those described in step 915. Alternately, to produce a structure similar to FIG. 8D, the second metal oxide may be ablated to expose the second portion of the metal component.

In step 940, the second portion of the metal component is laser polished to form a second polished region using a fourth laser-based process. In some implementations, step 940 is optional. The third laser-based process may use similar process conditions to those described in step 920.

In step 945, a third metal oxide is anodically grown along the second polished region. For example, the third metal oxide is grown as described in step 905. The thickness of the third metal oxide may be selected so that the surface of the second metal oxide is recessed with respect to the surface of the first metal oxide, is substantially flush with the surface of the first metal oxide, or projects with respect to the surface of the first metal oxide.

In step 950, the third metal oxide is dyed using a third pigment to produce a third color and sealed. The third color is different than the first color and the second color. The second metal oxide may be dyed and sealed as previously described at step 910. In some implementations, steps 945 and 950 are optional.

FIGS. 10A-10D schematically illustrate four stages in an example process for making an image comprising multiple pixels on a metallic substrate of an electronic device housing. For simplicity, the example process illustrated in FIGS. 10A-10D has fewer steps than in FIG. 9. The image comprises pixel 1032 and pixel 1034 defined respectively by metal oxide 1042 and metal oxide 1044. As illustrated, metal oxide 1041 is at the edge of the image and does not form a pixel of the image.

Figure 10A:
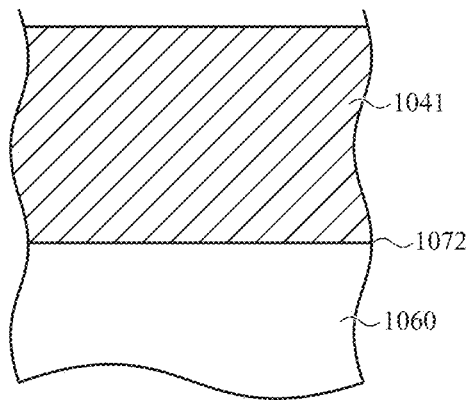
FIGS. 10A, 10B, 10C, and 10D illustrate stages in an example process for making a marking.

FIG. 10A illustrates an oxide layer formed by an example anodic oxidation step as in step 905 of FIG. 9. The oxide layer 1041 is anodically grown on a metallic substrate 1060 and forms interface 1071 with the metallic substrate 1060. In embodiments, the thickness of the layer is from 10 µm to 20 µm. The oxide layer 1041 may be sealed or dyed and sealed after it is grown.

Figure 10B:
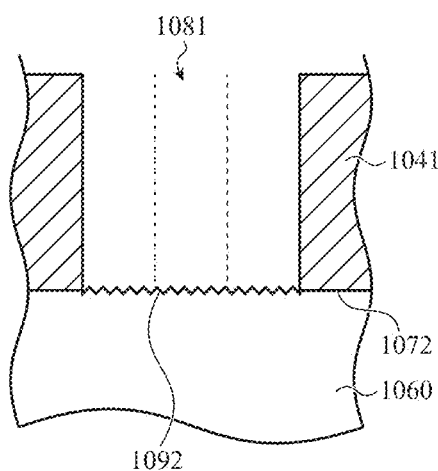

FIG. 10B illustrates the oxide layer 1041 of FIG. 10A after an example laser ablation step as in step 915 of FIG. 9. A section of the oxide layer 1041 of FIG. 10A is ablated to expose portion 1092 of the metallic substrate 1060; a portion of oxide layer 1041 remains. As shown in FIG. 10B, the operation of ablation may form an opening 1081 in oxide layer 1041 to expose portion 1092. Portion 1092 is schematically shown as having a surface texture including a first roughness. In embodiments, the exposed portion 1092 of the metallic substrate 1060 is not substantially recessed with respect to interface portion 1071 and may be recessed by 5 µm or less, 3 µm or less, 2 µm or less or 1 µm or less.

Figure 10C:
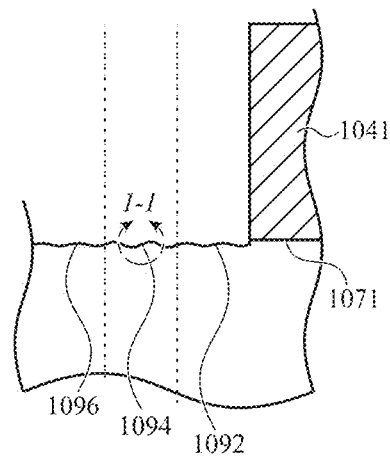

FIG. 10C illustrates the oxide layer 1041 and metallic substrate 1060 of FIG. 10B after an example laser polishing step as in step 920 of FIG. 9. FIG. 10C is an enlarged view of the right side of FIG. 10B and shows first polished region 1092 and second polished region 1094 after laser polishing using a second laser-based process. As illustrated, second polished region 1094 has a rougher surface texture than first polished region 1092. Different conditions for the second laser-based process may be used to produce a different surface textures on different polished regions.

Without wishing to be bound by any particular theory, the texture of a polished region of the metallic substrate, such as polished regions 1092 and 1094, may influence the texture of the interface between the metal oxide and the metal following anodization. For example, a rougher texture of the polished region prior to anodization may lead to a rougher texture of the interface after anodization. In addition, without wishing to be bound by any particular theory, the texture of polished region of the metallic substrate may influence growth of the metal oxide during anodization. For example, a rougher texture of the polished region may facilitate initiation of a porous structure in the metal oxide, may affect the nature of the porous structure, and/or may affect the growth rate of the metal oxide and the metal oxide thickness formed during anodization.

Figure 10D:
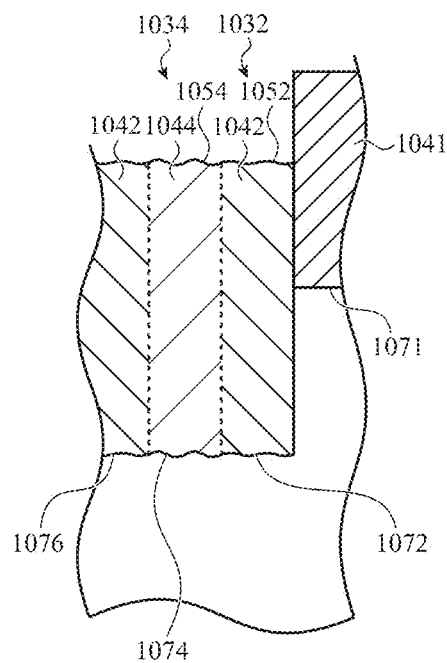

FIG. 10D illustrates the oxide layer 1041 and metallic substrate of FIG. 10C after an example anodization step as in step 925 of FIG. 9. As shown, metal oxides 1042 and 1044 are grown from the polished regions of the metallic substrate in a single anodization process. Different oxide materials formed in a single anodization process may have substantially the same composition, but may differ in appearance. For example, metal oxides 1042 and 1044 differ in visual appearance as a result of being grown on differently polished regions of the metallic substrate. In particular, metal oxide 1042 is grown from polished region 1092 and second metal oxide 1044 is grown from polished region 1094. First metal oxide 1042 defines surface 1052 of and forms interface 1072 with the metallic substrate. Similarly, second metal oxide 1044 defines surface 1054 of the second metal oxide 1044 and forms interface 1074 with the metallic substrate.

Figure 11:
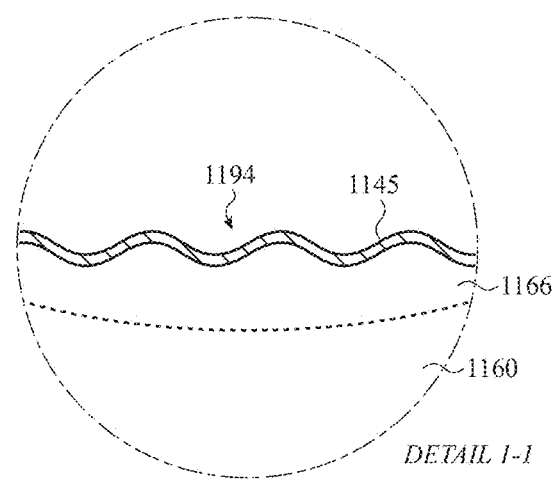
FIG. 11 shows an enlarged view of a textured portion of a metallic substrate.

FIG. 11 depicts an enlarged view of polished region 1094 from FIG. 10C. In the example shown, polished region 1194 further comprises thermally grown oxide layer 1145 forming an outer surface of the polished region 1194. The thermally grown oxide layer 1145 may be formed during laser polishing. Without wishing to be bound by any particular belief, in some embodiments the nature of the thermally grown oxide layer 1145 may affect the growth and/or color of the metal oxide during anodization.

The example shown in FIG. 11 also schematically indicates formation of a heat affected zone 1166 in the metallic substrate 1160 as a result of laser polishing. As example, the heat affected zone 1166 may differ in microstructure from other parts of the metallic substrate 1160. For example, the heat affected zone 1166 may differ in grain size and/or intermetallic size and distribution. Without wishing to be bound by any particular theory or belief, in some embodiments the nature of the heat affected zone 1166 may affect the structure, composition and/or growth of the metal oxide during anodization.

Figure 12:
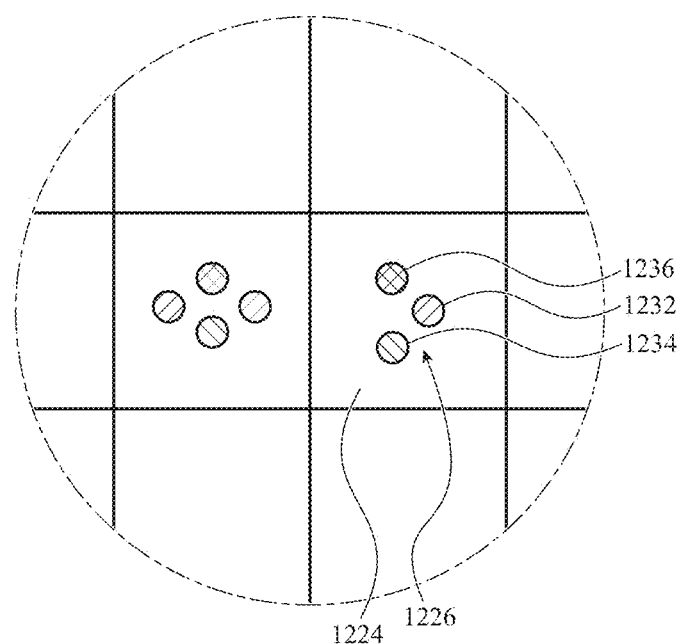
FIG. 12 shows an enlarged top view of a portion of an image.

FIG. 12 schematically illustrates an enlarged top view of a portion of an image formed using generally circular pixels. The gridlines in FIG. 12 separate the image into cells. Cell 1224 contains three pixels 1232, 1234, and 1236. In embodiments, the spacing between pixels 1232, 1234, and 1236 gives the pixels the appearance of a single "dot" 1226 when the image is viewed at a distance. The "dot" 1226 may appear to have a single hue resulting from the combined effect of pixels 1232, 1234, and 1236.

Figure 13:
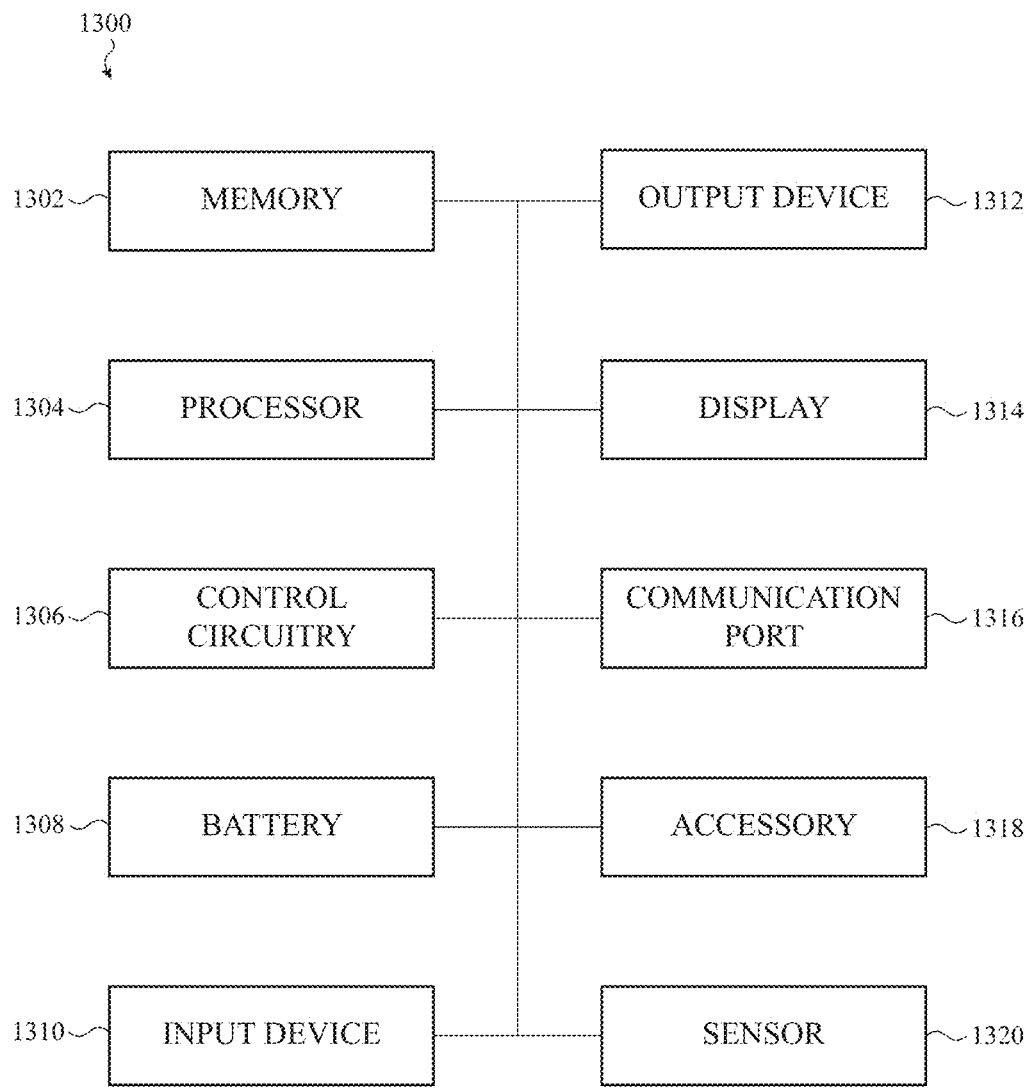
FIG. 13 shows a block diagram of components of an electronic device.

FIG. 13 is a block diagram of example components of an example electronic device. The schematic representation depicted in FIG. 13 may correspond to components of the devices depicted in FIG. 1A-12 as described above. However, FIG. 13 may also more generally represent other types of electronic devices with a marking, as described herein.

As shown in FIG. 13, the electronic device 1300 includes a processor 1304 operably connected with a computer-readable memory 1302. The processor 1304 may be operatively connected to the memory 1302 component via an electronic bus or bridge. The processor 1304 may be implemented as one or more computer processors or microcontrollers configured to perform operations in response to computer-readable instructions. The processor 1304 may include a central processing unit (CPU) of the device 1300. Additionally and/or alternatively, the processor 1304 may include other electronic circuitry within the device 1300 including application specific integrated chips (ASIC) and other microcontroller devices. The processor 1304 may be configured to perform functionality described in the examples above. In addition, the processor or other electronic circuitry within the device may be provided on or coupled to a flexible circuit board in order to accommodate folding or bending of the electronic device. A flexible circuit board may be a laminate including a flexible base material and a flexible conductor. Example base materials for flexible circuit boards include, but are not limited to, polymer materials such as vinyl (e.g., polypropylene), polyester (e.g., polyethylene terephthalate (PET), biaxially-oriented PET, and polyethylene napthalate (PEN)), polyimide, polyetherimide, polyaryletherketone (e.g., polyether ether ketone (PEEK)), fluoropolymer and copolymers thereof. A metal foil may be used to provide the conductive element of the flexible circuit board.

The memory 1302 may include a variety of types of non-transitory computer-readable storage media, including, for example, read access memory (RAM), read-only memory (ROM), erasable programmable memory (e.g., EPROM and EEPROM), or flash memory. The memory 1302 is configured to store computer-readable instructions, sensor values, and other persistent software elements The electronic device 1300 may include control circuitry 1306. The control circuitry 1306 may be implemented in a single control unit and not necessarily as distinct electrical circuit elements. As used herein, "control unit" will be used synonymously with "control circuitry." The control circuitry 1306 may receive signals from the processor 1304 or from other elements of the electronic device 1300.

As shown in FIG. 13, the electronic device 1300 includes a battery 1308 that is configured to provide electrical power to the components of the electronic device 1300. The battery 1308 may include one or more power storage cells that are linked together to provide an internal supply of electrical power. The battery 1308 may be operatively coupled to power management circuitry that is configured to provide appropriate voltage and power levels for individual components or groups of components within the electronic device 1300. The battery 1308, via power management circuitry, may be configured to receive power from an external source, such as an alternating current power outlet. The battery 1308 may store received power so that the electronic device 1300 may operate without connection to an external power source for an extended period of time, which may range from several hours to several days. The battery may be flexible to accommodate bending or flexing of the electronic device. For example, the battery may be mounted to a flexible housing or may be mounted to a flexible printed circuit. In some cases, the battery is formed from flexible anodes and flexible cathode layers and the battery cell is itself flexible. In some cases, individual battery cells are not flexible, but are attached to a flexible substrate or carrier that allows an array of battery cells to bend or fold around a foldable region of the device.

In some embodiments, the electronic device 1300 includes one or more input devices 1310. The input device 1310 is a device that is configured to receive input from a user or the environment. The input device 1310 may include, for example, a push button, a touch-activated button, a touch screen (e.g., a touch-sensitive display or a force-sensitive display), capacitive touch button, dial, crown, or the like. In some embodiments, the input device 1310 may provide a dedicated or primary function, including, for example, a power button, volume buttons, home buttons, scroll wheels, and camera buttons.

The device 1300 may also include one or more sensors 1320, such as a force sensor, a capacitive sensor, an accelerometer, a barometer, a gyroscope, a proximity sensor, a light sensor, or the like. The sensors 1320 may be operably coupled to processing circuitry. In some embodiments, the sensors 1320 may detect deformation and/or changes in configuration of the electronic device and be operably coupled to processing circuitry which controls the display based on the sensor signals. In some implementations, output from the sensors 1320 is used to reconfigure the display output to correspond to an orientation or folded/unfolded configuration or state of the device. Example sensors 1320 for this purpose include accelerometers, gyroscopes, magnetometers, and other similar types of position/ orientation sensing devices. In addition, the sensors 1320 may include a microphone, acoustic sensor, light sensor, optical facial recognition sensor, or other types of sensing device.

In some embodiments, the electronic device 1300 includes one or more output devices 1312 configured to provide output to a user. The output device may include display 1314 that renders visual information generated by the processor 1304. The output device may also include one or more speakers to provide audio output.

The display 1314 may include a liquid-crystal display (LCD), light-emitting diode, organic light-emitting diode (OLED) display, an active layer organic light emitting diode (AMOLED) display, organic electroluminescent (EL) display, electrophoretic ink display, or the like. If the display 1314 is a liquid-crystal display or an electrophoretic ink display, the display may also include a backlight component that can be controlled to provide variable levels of display brightness. If the display 1314 is an organic light-emitting diode or organic electroluminescent type display, the brightness of the display 1314 may be controlled by modifying the electrical signals that are provided to display elements. In addition, information regarding configuration and/or orientation of the electronic device may be used to control the output of the display as described with respect to input devices 1310.

In embodiments, an electronic device 1300 may include sensors 1320 to provide information regarding configuration and/or orientation of the electronic device in order to control the output of the display. For example, a portion of the display 1314 may be turned off, disabled, or put in a low energy state when all or part of the viewable area of the display 1314 is blocked or substantially obscured. As another example, the display 1314 may be adapted to rotate the display of graphical output based on changes in orientation of the device 1300 (e.g., 90 degrees or 180 degrees) in response to the device 1300 being rotated. As another example, the display 1314 may be adapted to rotate the display of graphical output in response to the device 1300 being folded or partially folded, which may result in a change in the aspect ratio or a preferred viewing angle of the viewable area of the display 1314.

The electronic device 1300 may also include a communication port 1316 that is configured to transmit and/or receive signals or electrical communication from an external or separate device. The communication port 1316 may be configured to couple to an external device via a cable, adaptor, or other type of electrical connector. In some embodiments, the communication port 1316 may be used to couple the electronic device to a host computer.

The electronic device may also include at least one accessory 1318, such as a camera, a flash for the camera, or other such device. The camera may be connected to other parts of the electronic device such as the control circuitry.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device housing comprising:
   a metallic substrate defining a recess having a recess surface surrounded by a set of recess walls and recessed with respect to an outer surface of the metallic substrate;
   an oxide layer formed on the recess surface, comprising a metal oxide, and defining an outer surface recessed with respect to the outer surface of the metallic substrate; and
   an image defined, in part, by an array of pixels formed from the oxide layer, the array of pixels comprising:
   a first pixel having a first color defined, in part, by a first thickness of a first portion of the oxide layer;
   a second pixel having a second color different from the first color and defined, in part, by a second thickness of a second portion of the oxide layer; and
   a third pixel having a third color different from the first and the second colors and defined, in part, by a third thickness of a third portion of the oxide layer.

2. The electronic device housing of claim 1, wherein:
   the first color corresponds to a red color;
   the second color corresponds to a yellow color; and
   the third color corresponds to a blue color.

3. The electronic device of claim 1, wherein:
   the first pixel has a thickness variation of 10% about the first thickness;
   the second pixel has a thickness variation of 10% about the second thickness;
   and the third pixel has a thickness variation of about 10% about the third thickness.

4. The electronic device housing of claim 1, wherein:
   the image comprises a multi-pixel dot comprising two or more of:
   the first pixel having the first color;
   the second pixel having the second color; or
   the third pixel having the third color; and
   the multi-pixel dot appears to have a fourth color visually distinct from the first, the second, and the third colors.

5. The electronic device housing of claim 1, wherein:
   the metal oxide defines a void;
   the image further comprises a fourth pixel having a fourth color different from the first, the second, and the third colors; and
   the fourth color is defined, at least in part, by the metallic substrate at a location of the void.

6. The electronic device housing of claim 1, wherein the first color is due, in part, to a reflection of light along an interface between the oxide layer and the metallic substrate at the first portion.

7. The electronic device housing of claim 1, wherein each of the first pixel, the second pixel, and the third pixel have a width ranging from about 10 μm to about 50 μm.

8. An electronic device housing comprising:
   a metallic substrate;
   an oxide layer formed on the metallic substrate; and an image defined, in part, by the oxide layer and including a set of pixels comprising:
a first pixel having a first color and defined by a first metal oxide anodically grown on a first portion of the metallic substrate and defining a first interface with the first portion of the metallic substrate; and
a second pixel having a second color different from the first color and defined by a second metal oxide anodically grown on a second portion of the metallic substrate adjacent to the first portion and the second metal oxide defining a second interface with the second portion of the metallic substrate, the second interface recessed with respect to the first interface.

9. The electronic device housing of claim 8, wherein:
the first color of the first pixel is due, at least in part, to a first dye incorporated into the first metal oxide; and
the second color of the second pixel is due, at least in part, to a second dye incorporated into the second metal oxide.

10. The electronic device housing of claim 9, wherein:
the set of pixels further comprises a third pixel having a third color and defined by a third metal oxide anodically grown on a third portion of the metallic substrate;
the third color is different than the first and the second colors; and
the third color of the third pixel is due, at least in part, to a third dye incorporated into the third metal oxide.

11. The electronic device housing of claim 10, wherein:
each of the first pixel, the second pixel, and the third pixel have a width from about 10 μm to about 50 μm;
the first color corresponds to a yellow color;
the second color corresponds to a magenta color; and
the third color corresponds to a cyan color.

12. The electronic device housing of claim 8, wherein:
the first color comprises a first hue and a first brightness;
the first hue is due, at least in part, to a first dye incorporated into the first metal oxide; and
the first brightness is due, at least in part, to a first reflectance of visible light at the first pixel;
the second color comprises a second hue and a second brightness, the second hue being different than the first hue, the second brightness being different than the first brightness, or a combination thereof;
the second hue is due, at least in part, to a second dye incorporated into the second metal oxide; and
the second brightness is due, at least in part, to a second reflectance of visible light at the second pixel.

13. The electronic device housing of claim 12, wherein:
the first brightness is greater than the second brightness; and
a second interface between the second metal oxide and the metallic substrate is rougher than a first interface between the first metal oxide and the metallic substrate.

14. The electronic device housing of claim 13, wherein:
the second interface between the second metal oxide and the metallic substrate comprises periodic features; and
the second hue is due, in part, to diffraction of light from the periodic features.

15. The electronic device housing of claim 8, wherein:
each of the first pixel and the second pixel comprises a plurality of pores.

16. The electronic device housing of claim 8, wherein each of the first pixel and the second pixel have a width ranging from about 10 μm to about 50 μm.

17. A method of forming an image along an exterior surface of a metallic housing component, the method comprising:
forming a recess along the exterior surface of the metallic housing component by ablating the metallic housing component using a first laser-based process, the recess having a recess surface surrounded by a set of recess walls and recessed with respect to an outer surface of the metallic substrate;
thermally growing an oxide layer comprising a metal oxide along the surface of the recess, the oxide layer grown using a second laser-based process and defining an outer surface recessed with respect to the outer surface of the metallic substrate; and
forming the image in the oxide layer by:
ablating a first section of the oxide layer to define a first pixel having a first thickness and a first color using a third laser-based process;
ablating a second section of the oxide layer to define a second pixel having a second thickness and a second color using a fourth laser-based process; and
ablating a third section of the oxide layer to define a third pixel having a third thickness and a third color using a fifth laser-based process.

18. The method of claim 17, wherein:
the first laser-based process includes a first femtosecond laser operating at a first average power from about 1 W to about 5 W;
the second laser-based process includes a second nanosecond laser operating at a second average power from about 1 W to about 5 W;
the third laser-based process includes a third femtosecond laser operating at a third average power from about 0.05 W to about 0.5 W;
the fourth laser-based process includes a fourth femtosecond laser operating at a fourth average power from about 0.05 W to about 0.5 W; and
the fifth laser-based process includes a fifth femtosecond laser operating at a fifth average power from about 0.05 W to about 0.5 W.

19. The method of claim 17, wherein each of the first pixel, the second pixel, and the third pixel have a width ranging from about 10 μm to about 50 μm due to a spot size of a laser used to perform the third, the fourth and the fifth laser-based processes.

* * * * *